United States Patent
Krampf et al.

(10) Patent No.: US 11,126,397 B2
(45) Date of Patent: Sep. 21, 2021

(54) MUSIC AUDIO CONTROL AND DISTRIBUTION SYSTEM IN A LOCATION

(71) Applicant: Chestnut Hill Sound, Inc., Waban, MA (US)

(72) Inventors: Steven Krampf, Brookline, MA (US); Evan B. Ross, Newton, MA (US); Trung Quoc Phung, Milton, MA (US)

(73) Assignee: Chestnut Hill Sound, Inc., Waban, MA (US)

( * ) Notice: Subject to any disclaimer, the term of this patent is extended or adjusted under 35 U.S.C. 154(b) by 52 days.

(21) Appl. No.: 16/704,165

(22) Filed: Dec. 5, 2019

(65) Prior Publication Data

US 2020/0110576 A1    Apr. 9, 2020

Related U.S. Application Data

(63) Continuation of application No. 16/426,123, filed on May 30, 2019, now abandoned, which is a
(Continued)

(51) Int. Cl.
*H04B 1/16* (2006.01)
*H04B 1/08* (2006.01)
(Continued)

(52) U.S. Cl.
CPC ............ *G06F 3/165* (2013.01); *G06F 3/0482* (2013.01); *G06F 3/04847* (2013.01);
(Continued)

(58) Field of Classification Search
CPC .... H04B 1/08; H04B 1/082; H04B 2001/084; H04B 1/16; H04H 60/00; H04H 60/29; H04H 60/35; H04H 60/47; H04H 60/68
See application file for complete search history.

(56) References Cited

U.S. PATENT DOCUMENTS 2,579,659 A    12/1951    Fisher
4,027,251 A    5/1977    Fathauer et al.
(Continued)

FOREIGN PATENT DOCUMENTS

CA    2 388 986 A1    12/2003
DE    30 32 798 A1    3/1981
(Continued)

OTHER PUBLICATIONS

Angell, R. "Harman offers iPod photo adapter for JBL on Stage," iLounge, Jun. 1, 2005, downloaded and printed Nov. 15, 2010 from http://www.ilounge.com/index.php/news/comments/harman-offers-ipod-photo-adapter-for-jbl-on-stage/.
(Continued)

*Primary Examiner* — Blane J Jackson

(57) ABSTRACT

A music audio control and distribution system in a location, comprising a first wireless music audio device connected to a local network, the network operably connecting the music audio device with at least one of: (1) a music audio player or (2) a music audio output device, and with a remote music audio source operably connected to the local network. The location of the local network is one of (a) a home, (b) an office, and (c) an automobile. The system also includes a second music audio device comprising at least one of (i) a music audio player or (ii) a music audio output device. The second music audio device is also connected to the local network and is controllable by the first wireless music audio device.

20 Claims, 17 Drawing Sheets

Related U.S. Application Data continuation of application No. 14/944,789, filed on Nov. 18, 2015, now Pat. No. 10,310,801, which is a continuation of application No. 14/243,915, filed on Apr. 3, 2014, now Pat. No. 9,225,773, which is a continuation of application No. 12/906,047, filed on Oct. 15, 2010, now Pat. No. 8,843,092, which is a continuation of application No. 11/260,699, filed on Oct. 27, 2005, now Pat. No. 7,885,622.

(60) Provisional application No. 60/622,924, filed on Oct. 27, 2004, provisional application No. 60/637,669, filed on Dec. 20, 2004, provisional application No. 60/708,673, filed on Aug. 16, 2005, provisional application No. 60/623,006, filed on Oct. 27, 2004.

(51) Int. Cl.

| | | |
|---|---|---|
| *G06F 3/16* | (2006.01) | |
| *G06F 3/0484* | (2013.01) | |
| *H04B 1/20* | (2006.01) | |
| *G08B 29/18* | (2006.01) | |
| *H04L 29/08* | (2006.01) | |
| *H03J 1/00* | (2006.01) | |
| *H04R 1/02* | (2006.01) | |
| *G06F 3/0482* | (2013.01) | |
| *H04H 40/45* | (2008.01) | |
| *H04H 60/74* | (2008.01) | |

(52) U.S. Cl.
CPC .......... *G08B 29/185* (2013.01); *H03J 1/0025* (2013.01); *H04B 1/088* (2013.01); *H04B 1/20* (2013.01); *H04L 67/10* (2013.01); *H04R 1/028* (2013.01); *H03J 2200/25* (2013.01); *H04H 40/45* (2013.01); *H04H 60/74* (2013.01); *H04R 2205/021* (2013.01); *H04R 2430/01* (2013.01)

(56) References Cited

U.S. PATENT DOCUMENTS

| | | |
|---|---|---|
| 4,057,760 A | 11/1977 | Koch |
| 4,223,406 A | 9/1980 | Someno |
| 4,236,251 A | 11/1980 | Ohgishi et al. |
| 4,249,255 A | 2/1981 | Molinari |
| 4,266,295 A | 5/1981 | Bach, Jr. |
| 4,344,186 A | 8/1982 | Ong |
| 5,014,348 A | 5/1991 | Boone et al. |
| 5,268,889 A | 12/1993 | Furukawa et al. |
| 5,278,837 A | 1/1994 | Kelley |
| 5,280,229 A | 1/1994 | Faude et al. |
| 5,280,636 A | 1/1994 | Kelley et al. |
| 5,438,325 A | 8/1995 | Nishigaki et al. |
| 5,532,684 A | 7/1996 | Katsu |
| 5,550,735 A | 8/1996 | Slade et al. |
| 5,616,876 A | 4/1997 | Cluts |
| 5,666,422 A | 9/1997 | Harrison et al. |
| 5,689,353 A | 11/1997 | Darbee et al. |
| 5,722,041 A | 2/1998 | Freadman |
| 5,778,256 A | 7/1998 | Darbee |
| 5,787,259 A | 7/1998 | Haroun et al. |
| 5,845,282 A | 12/1998 | Alley et al. |
| 6,005,490 A | 12/1999 | Higashihara |
| 6,055,216 A | 4/2000 | Shintani |
| 6,088,318 A | 7/2000 | Sone |
| 6,093,880 A | 7/2000 | Arnalds |
| 6,094,153 A | 7/2000 | Rumsey et al. |
| 6,127,941 A | 10/2000 | Van Ryzin |
| 6,148,253 A | 11/2000 | Taguchi et al. |
| 6,192,340 B1 | 2/2001 | Abecassis |
| 6,272,446 B1 | 8/2001 | Baekke et al. |
| 6,288,749 B1 | 9/2001 | Freadman |
| 6,304,523 B1 | 10/2001 | Jones et al. |
| 6,334,157 B1 | 12/2001 | Oppermann et al. |
| 6,389,463 B2 | 5/2002 | Bolas et al. |
| 6,400,280 B1 | 6/2002 | Osakabe |
| 6,423,892 B1 | 7/2002 | Ramaswamy |
| 6,476,825 B1 | 11/2002 | Croy et al. |
| 6,501,389 B1 | 12/2002 | Aguirre |
| 6,505,160 B1 | 1/2003 | Levy et al. |
| 6,529,804 B1 | 3/2003 | Draggon et al. |
| 6,532,592 B1 | 3/2003 | Shintani et al. |
| 6,545,587 B1 | 4/2003 | Hatakeyama et al. |
| 6,546,262 B1 | 4/2003 | Freadman |
| 6,553,215 B1 | 4/2003 | Chung |
| 6,563,729 B2 | 5/2003 | Brucklmeier et al. |
| 6,563,769 B1 | 5/2003 | Van Der Meulen |
| 6,591,085 B1 | 7/2003 | Grady |
| 6,608,572 B1 | 8/2003 | Venkitachalam et al. |
| 6,636,171 B2 | 10/2003 | Chang |
| 6,728,729 B1 | 4/2004 | Jawa et al. |
| 6,741,869 B1 | 5/2004 | Lehr |
| 6,778,869 B2 | 8/2004 | Champion |
| 6,781,519 B1 | 8/2004 | Diaz |
| 6,784,805 B2 | 8/2004 | Harris et al. |
| 6,784,872 B1 | 8/2004 | Matsui et al. |
| 6,792,323 B2 | 9/2004 | Krzyzanowski et al. |
| 6,856,820 B1 | 2/2005 | Kolls |
| 6,864,798 B2 | 3/2005 | Janik |
| 6,897,905 B2 | 5/2005 | Kaminosono |
| 6,899,365 B2 | 5/2005 | Lavelle et al. |
| 6,907,232 B2 | 6/2005 | Suzuki et al. |
| 6,912,385 B2 | 6/2005 | Namba et al. |
| 6,914,551 B2 | 7/2005 | Vidal |
| 6,920,479 B2 | 7/2005 | McDowall et al. |
| 6,928,261 B2 | 8/2005 | Hasegawa et al. |
| 6,928,309 B2 * | 8/2005 | Jinnouchi ............ H04B 1/3888 455/344 |
| 6,928,433 B2 | 8/2005 | Goodman et al. |
| 6,934,106 B2 | 8/2005 | Takada |
| 6,938,101 B2 | 8/2005 | Hayes et al. |
| 6,942,511 B1 | 9/2005 | Orsley |
| 6,946,988 B2 | 9/2005 | Edwards et al. |
| 6,956,833 B1 | 10/2005 | Yukie et al. |
| 6,969,794 B2 | 11/2005 | Suzuki |
| 6,976,216 B1 | 12/2005 | Peskin et al. |
| 6,980,150 B2 | 12/2005 | Conway, Jr. et al. |
| 6,993,615 B2 | 1/2006 | Falcon |
| 7,024,256 B2 | 4/2006 | Krzyzanowski et al. |
| 7,068,765 B2 | 6/2006 | Chen |
| 7,088,575 B2 | 8/2006 | Chiu et al. |
| 7,095,867 B2 | 8/2006 | Schul et al. |
| 7,110,838 B1 | 9/2006 | Tada |
| 7,127,305 B1 | 10/2006 | Palmon |
| 7,129,855 B2 | 10/2006 | Krzyzanowski et al. |
| 7,130,616 B2 | 10/2006 | Janik |
| 7,136,709 B2 | 11/2006 | Arling et al. |
| 7,141,732 B2 | 11/2006 | Tsuboi |
| 7,143,214 B2 | 11/2006 | Hayes et al. |
| 7,154,862 B2 | 12/2006 | Krzyzanowski |
| 7,155,214 B2 | 12/2006 | Struthers et al. |
| 7,158,757 B2 | 1/2007 | Buttet |
| 7,168,991 B2 | 1/2007 | Sano |
| 7,184,259 B2 | 2/2007 | Marler et al. |
| 7,184,848 B2 | 2/2007 | Krzyzanowski et al. |
| 7,187,947 B1 | 3/2007 | White et al. |
| 7,191,193 B2 | 3/2007 | Ben-Yaacov et al. |
| 7,200,644 B1 | 4/2007 | Flanagan |
| 7,205,471 B2 | 4/2007 | Looney et al. |
| 7,213,085 B2 | 5/2007 | Henshaw et al. |
| 7,213,228 B2 | 5/2007 | Putterman et al. |
| 7,216,178 B2 | 5/2007 | Juszkiewicz |
| 7,230,563 B2 | 6/2007 | Vidal |
| 7,230,822 B2 | 6/2007 | Langberg et al. |
| 7,231,270 B2 | 6/2007 | Kamdar et al. |
| 7,231,516 B1 | 6/2007 | Sparrell et al. |
| 7,233,779 B2 | 6/2007 | Mere et al. |
| 7,243,307 B2 | 6/2007 | Gao et al. |
| 7,245,274 B2 | 7/2007 | Schedvy |
| 7,253,765 B2 | 8/2007 | Edwards et al. |
| 7,277,765 B1 | 10/2007 | Beckmann et al. |

(56) References Cited

U.S. PATENT DOCUMENTS

| | | |
|---|---|---|
| 7,280,802 B2 | 10/2007 | Grady |
| 7,283,059 B2 | 10/2007 | Harris et al. |
| 7,284,036 B2 | 10/2007 | Ramaswamy |
| 7,292,881 B2 | 11/2007 | Seil et al. |
| 7,308,464 B2 | 12/2007 | Nowitz et al. |
| 7,324,833 B2 | 1/2008 | White et al. |
| 7,333,025 B2 | 2/2008 | Oosugi |
| 7,337,461 B2 | 2/2008 | Imada et al. |
| 7,340,221 B2 | 3/2008 | Wikel et al. |
| 7,343,141 B2 | 3/2008 | Ellis et al. |
| 7,352,567 B2 | 4/2008 | Hotelling et al. |
| 7,354,091 B2 | 4/2008 | Lavelle et al. |
| 7,356,141 B2 | 4/2008 | Hsieh et al. |
| 7,373,414 B2 | 5/2008 | Evron et al. |
| 7,375,673 B2 | 5/2008 | Spilo |
| 7,440,772 B2 | 10/2008 | White et al. |
| 7,441,058 B1 | 10/2008 | Bolton et al. |
| 7,441,062 B2 | 10/2008 | Novotney et al. |
| 7,441,084 B2 | 10/2008 | Henshaw et al. |
| 7,444,336 B2 | 10/2008 | Karaoguz et al. |
| 7,453,590 B2 | 11/2008 | Yoshiura et al. |
| 7,483,958 B1 | 1/2009 | Elabbady et al. |
| 7,486,926 B2 | 2/2009 | White et al. |
| 7,489,786 B2 | 2/2009 | Marlowe |
| 7,493,142 B2 | 2/2009 | Struthers et al. |
| 7,509,181 B2 | 3/2009 | Champion |
| 7,512,882 B2 | 3/2009 | Fong et al. |
| 7,535,465 B2 | 5/2009 | Morse et al. |
| 7,536,420 B2 | 5/2009 | Takashima |
| 7,536,706 B1 | 5/2009 | Sezan et al. |
| 7,542,814 B2 | 6/2009 | Barr |
| 7,548,851 B1 | 6/2009 | Lau et al. |
| 7,560,637 B1 | 7/2009 | Robbin et al. |
| 7,571,014 B1 | 8/2009 | Lambourne et al. |
| 7,574,177 B2 | 8/2009 | Tupman et al. |
| 7,574,691 B2 | 8/2009 | Freitas et al. |
| 7,574,723 B2 | 8/2009 | Putterman et al. |
| 7,579,961 B2 | 8/2009 | Krzyzanowski et al. |
| 7,580,255 B2 | 8/2009 | Crooijmans et al. |
| 7,593,782 B2 | 9/2009 | Jobs et al. |
| 7,594,245 B2 | 9/2009 | Sezan et al. |
| 7,595,846 B2 | 9/2009 | Moon |
| 7,599,610 B2 | 10/2009 | Benyamin et al. |
| 7,606,790 B2 | 10/2009 | Levy |
| 7,607,156 B2 | 10/2009 | Shintani et al. |
| 7,627,343 B2 | 12/2009 | Fadell et al. |
| 7,634,228 B2 | 12/2009 | White et al. |
| 7,634,263 B2 | 12/2009 | Louch et al. |
| 7,660,929 B2 | 2/2010 | Novotney et al. |
| 7,668,990 B2 | 2/2010 | Krzyzanowski et al. |
| 7,684,570 B2 | 3/2010 | Riggs |
| 7,689,197 B2 | 3/2010 | Laude et al. |
| 7,702,279 B2 | 4/2010 | Ko et al. |
| 7,707,606 B2 | 4/2010 | Hpfrichter et al. |
| 7,765,326 B2 | 4/2010 | Robbin et al. |
| 7,715,187 B2 | 5/2010 | Hotelling et al. |
| 7,719,830 B2 | 5/2010 | Howarth et al. |
| 7,721,208 B2 | 5/2010 | Madden |
| 7,730,012 B2 | 6/2010 | Arrouye et al. |
| 7,730,223 B1 | 6/2010 | Bavor et al. |
| 7,740,498 B1 | 6/2010 | Orsley |
| 7,769,903 B2 | 8/2010 | Robbin et al. |
| 7,774,708 B2 | 8/2010 | Bell et al. |
| 7,778,595 B2 | 8/2010 | White et al. |
| 7,783,070 B2 | 8/2010 | Fadell et al. |
| 7,792,524 B2 | 9/2010 | Struthers et al. |
| 7,805,135 B2 | 9/2010 | Struthers et al. |
| 7,823,214 B2 | 10/2010 | Rubinstein et al. |
| 7,643,283 B2 | 11/2010 | Jubelirer et al. |
| 7,840,740 B2 | 11/2010 | Minoo |
| 7,865,927 B2 | 1/2011 | Brodersen et al. |
| 7,873,630 B2 | 1/2011 | Arrouye et al. |
| 7,873,771 B2 | 1/2011 | Krueger et al. |
| 7,885,622 B2 | 2/2011 | Krampf et al. |
| 7,909,397 B2 | 3/2011 | Shalam et al. |
| 7,916,467 B2 | 3/2011 | Hotelling et al. |
| 7,917,661 B2 | 3/2011 | Bavor et al. |
| 7,930,369 B2 | 4/2011 | Marriott et al. |
| 8,045,952 B2 | 10/2011 | Qureshey et al. |
| 8,050,652 B2 | 11/2011 | Qureshey et al. |
| 8,054,211 B2 | 11/2011 | Vidal |
| 8,090,309 B2 | 1/2012 | Krampf et al. |
| 8,195,114 B2 | 1/2012 | Krampf et al. |
| 8,156,104 B2 | 4/2012 | Arrouye et al. |
| 8,156,106 B2 | 4/2012 | Arrouye et al. |
| 8,156,123 B2 | 4/2012 | Arrouye et al. |
| 8,156,528 B2 | 4/2012 | Baumgartner et al. |
| 8,355,690 B2 | 1/2013 | Krampf et al. |
| 8,554,133 B1 | 10/2013 | Feldman et al. |
| 8,577,205 B2 | 11/2013 | Barton et al. |
| 8,655,303 B2 | 2/2014 | Krampf et al. |
| 8,725,063 B2 | 5/2014 | Krampf et al. |
| 8,755,763 B2 | 6/2014 | Qureshey et al. |
| 8,792,850 B2 | 7/2014 | Qureshey et al. |
| 8,843,092 B2 | 9/2014 | Krampf et al. |
| 8,918,480 B2 | 9/2014 | Qureshey et al. |
| 8,977,375 B2 | 3/2015 | Beckmann et al. |
| 9,225,773 B2 | 12/2015 | Krampf et al. |
| 9,312,827 B2 | 4/2016 | Qureshey et al. |
| 9,369,101 B2 | 6/2016 | Qureshey et al. |
| 9,397,627 B2 | 7/2016 | Qureshey et al. |
| 9,549,001 B1 | 1/2017 | Qureshey et al. |
| 9,552,188 B1 | 1/2017 | Qureshey et al. |
| 10,114,608 B2 | 10/2018 | Krampf et al. |
| 10,310,801 B2 | 6/2019 | Krampf et al. |
| 2001/0042109 A1 | 11/2001 | Bolas et al. |
| 2002/0002039 A1 | 1/2002 | Qureshey et al. |
| 2002/0002707 A1 | 1/2002 | Ekel et al. |
| 2002/0003471 A1 | 1/2002 | Troedel et al. |
| 2002/0010755 A1 | 1/2002 | Rankin |
| 2002/0016165 A1 | 2/2002 | Davies et al. |
| 2002/0032813 A1 | 3/2002 | Hosaka et al. |
| 2002/0042282 A1 | 4/2002 | Haupt |
| 2002/0045960 A1 | 4/2002 | Phillips et al. |
| 2002/0048224 A1 | 4/2002 | Dygert et al. |
| 2002/0065096 A1 | 5/2002 | Yamamoto |
| 2002/0071448 A1 | 6/2002 | Cervello et al. |
| 2002/0072326 A1 | 6/2002 | Qureshey et al. |
| 2002/0072390 A1 | 6/2002 | Uchiyama |
| 2002/0073171 A1 | 6/2002 | McDowall et al. |
| 2002/0080166 A1 | 6/2002 | Sweatt, III et al. |
| 2002/0093593 A1 | 7/2002 | Perkes |
| 2002/0129693 A1 | 9/2002 | Wilks |
| 2002/0151327 A1 | 10/2002 | Levitt |
| 2002/0194601 A1 | 12/2002 | Perkes et al. |
| 2003/0014755 A1 | 1/2003 | Williams |
| 2003/0026440 A1 | 2/2003 | Lazzeroni et al. |
| 2003/0050058 A1 | 3/2003 | Walsh et al. |
| 2003/0059038 A1 | 3/2003 | Meyerson et al. |
| 2003/0077065 A1 | 4/2003 | Schlten et al. |
| 2003/0079038 A1 | 4/2003 | Robbin et al. |
| 2003/0084452 A1 | 5/2003 | Ryan et al. |
| 2003/0110503 A1 | 6/2003 | Perkes |
| 2003/0110514 A1 | 6/2003 | West et al. |
| 2003/0112585 A1 | 6/2003 | Silvester |
| 2003/0148740 A1 | 8/2003 | Yau et al. |
| 2003/0167318 A1 | 9/2003 | Robbin et al. |
| 2003/0176935 A1 | 9/2003 | Lian et al. |
| 2003/0236906 A1 | 12/2003 | Klemets et al. |
| 2004/0047588 A1 | 3/2004 | Okada et al. |
| 2004/0055446 A1 | 3/2004 | Robbin et al. |
| 2004/0068756 A1 | 4/2004 | Chiu |
| 2004/0075694 A1 | 4/2004 | Partridge et al. |
| 2004/0078812 A1 | 4/2004 | Calvert |
| 2004/0088731 A1 | 5/2004 | Putterman et al. |
| 2004/0090984 A1 | 5/2004 | Saint-Hilaire et al. |
| 2004/0133914 A1 | 7/2004 | Smith et al. |
| 2004/0162029 A1 | 8/2004 | Grady |
| 2004/0162845 A1 | 8/2004 | Kim et al. |
| 2004/0174858 A1 | 9/2004 | Caspi et al. |
| 2004/0177063 A1 | 9/2004 | Weber et al. |
| 2004/0183756 A1 | 9/2004 | Freitas et al. |
| 2004/0183827 A1 | 9/2004 | Putterman et al. |
| 2004/0203351 A1 | 10/2004 | Shearer et al. |

(56) References Cited

U.S. PATENT DOCUMENTS

| | | |
|---|---|---|
| 2004/0203738 A1 | 10/2004 | Janssen et al. |
| 2004/0210933 A1 | 10/2004 | Dresti et al. |
| 2004/0224638 A1 | 11/2004 | Fadell et al. |
| 2004/0234085 A1 | 11/2004 | Lennox |
| 2004/0242224 A1 | 12/2004 | Janik et al. |
| 2004/0267390 A1 | 12/2004 | Ben-Yaacov et al. |
| 2005/0014536 A1 | 1/2005 | Grady |
| 2005/0024226 A1 | 2/2005 | Hayes et al. |
| 2005/0027549 A1 | 2/2005 | Chen et al. |
| 2005/0042983 A1 | 2/2005 | Borgward |
| 2005/0047071 A1 | 3/2005 | Hin |
| 2005/0065624 A1 | 3/2005 | Ben-Yaacov et al. |
| 2005/0065912 A1 | 3/2005 | Cafrelli et al. |
| 2005/0068222 A1 | 3/2005 | Krzyzanowski et al. |
| 2005/0070157 A1 | 3/2005 | Neo et al. |
| 2005/0076388 A1 | 4/2005 | Morse et al. |
| 2005/0078087 A1 | 4/2005 | Gates et al. |
| 2005/0097478 A1 | 5/2005 | Kikkian et al. |
| 2005/0125087 A1 | 6/2005 | Ben-Yaacov et al. |
| 2005/0132055 A1 | 6/2005 | Neogi |
| 2005/0132295 A1 | 6/2005 | Noll et al. |
| 2005/0132405 A1 | 6/2005 | AbiEzzi et al. |
| 2005/0138664 A1 | 6/2005 | Neogi |
| 2005/0155077 A1 | 7/2005 | Lawrnce et al. |
| 2005/0157458 A1 | 7/2005 | Yin et al. |
| 2005/0159823 A1 | 7/2005 | Hayes et al. |
| 2005/0183104 A1 | 8/2005 | Edwards et al. |
| 2005/0197964 A1 | 9/2005 | Duggan |
| 2005/0210101 A1 | 9/2005 | Janik |
| 2005/0235210 A1 | 10/2005 | Peskin et al. |
| 2005/0239434 A1 | 10/2005 | Marlowe |
| 2005/0256875 A1 | 11/2005 | Rietschel |
| 2005/0265569 A1 | 12/2005 | Langberg et al. |
| 2005/0273790 A1 | 12/2005 | Kearney, III et al. |
| 2005/0281414 A1 | 12/2005 | Simon et al. |
| 2005/0283791 A1 | 12/2005 | McCarthy et al. |
| 2005/0283814 A1 | 12/2005 | Scott et al. |
| 2005/0285750 A1 | 12/2005 | Hayes et al. |
| 2006/0012488 A1 | 1/2006 | Hilbrink et al. |
| 2006/0013411 A1 | 1/2006 | Lin |
| 2006/0015757 A1 | 1/2006 | Tupman et al. |
| 2006/0031549 A1 | 2/2006 | Janik et al. |
| 2006/0031550 A1 | 2/2006 | Janik et al. |
| 2006/0036959 A1 | 2/2006 | Heatherly et al. |
| 2006/0039263 A1 | 2/2006 | Trotabas |
| 2006/0041655 A1 | 2/2006 | Holloway et al. |
| 2006/0041926 A1 | 2/2006 | Istvan et al. |
| 2006/0044466 A1 | 3/2006 | Kelly et al. |
| 2006/0052144 A1 | 3/2006 | Seil et al. |
| 2006/0064720 A1 | 3/2006 | Istvan et al. |
| 2006/0067304 A1 | 3/2006 | McDowall et al. |
| 2006/0080103 A1 | 4/2006 | Van Breemen |
| 2006/0085635 A1 | 4/2006 | Park |
| 2006/0085821 A9 | 4/2006 | Simmons et al. |
| 2006/0107330 A1 | 5/2006 | Ben-Yaacov et al. |
| 2006/0112188 A1 | 5/2006 | Albanese et al. |
| 2006/0116009 A1 | 6/2006 | Langberg et al. |
| 2006/0125445 A1 | 6/2006 | Cao et al. |
| 2006/0127034 A1 | 6/2006 | Brooking et al. |
| 2006/0134959 A1 | 6/2006 | Ellenbogen |
| 2006/0143327 A1 | 6/2006 | Hsieh et al. |
| 2006/0146765 A1 | 7/2006 | Van De Sluis et al. |
| 2006/0149813 A1 | 7/2006 | Janik |
| 2006/0159109 A1 | 7/2006 | Lamkin et al. |
| 2006/0161635 A1 | 7/2006 | Lamkin et al. |
| 2006/0165063 A1 | 7/2006 | Iwamura |
| 2006/0178766 A1 | 8/2006 | Schuppaer et al. |
| 2006/0179109 A1 | 8/2006 | Ko |
| 2006/0194612 A1 | 8/2006 | Chen |
| 2006/0206428 A1 | 9/2006 | Vidos et al. |
| 2006/0206799 A1 | 9/2006 | Vidos et al. |
| 2006/0209641 A1 | 9/2006 | Navid |
| 2006/0210092 A1 | 9/2006 | Navid |
| 2006/0230911 A1 | 10/2006 | Contois et al. |
| 2006/0256475 A1 | 11/2006 | Lindsay et al. |
| 2006/0274910 A1 | 12/2006 | Schul et al. |
| 2006/0277555 A1 | 12/2006 | Howard et al. |
| 2006/0280045 A1 | 12/2006 | Ritsher et al. |
| 2006/0288036 A1 | 12/2006 | Sadovsky et al. |
| 2007/0005503 A1 | 1/2007 | Engstrom et al. |
| 2007/0005655 A1 | 1/2007 | Takehara et al. |
| 2007/0006255 A1 | 1/2007 | Cain |
| 2007/0015486 A1 | 1/2007 | Marlowe |
| 2007/0016865 A1 | 1/2007 | Johnson et al. |
| 2007/0019682 A1 | 1/2007 | Krzyzanowski |
| 2007/0019683 A1 | 1/2007 | Krzyzanowski |
| 2007/0026799 A1 | 2/2007 | Wang et al. |
| 2007/0038434 A1 | 2/2007 | Cvetko |
| 2007/0038999 A1 | 2/2007 | Millington |
| 2007/0050458 A1 | 3/2007 | Rotzoll et al. |
| 2007/0053523 A1 | 3/2007 | Iuliis et al. |
| 2007/0055982 A1 | 3/2007 | Spilo |
| 2007/0078993 A1 | 4/2007 | Issa |
| 2007/0080823 A1 | 4/2007 | Fu et al. |
| 2007/0086724 A1 | 4/2007 | Grady et al. |
| 2007/0088804 A1 | 4/2007 | Qureshey et al. |
| 2007/0089132 A1 | 4/2007 | Qureshey et al. |
| 2007/0089135 A1 | 4/2007 | Qureshey et al. |
| 2007/0114974 A1 | 5/2007 | Grady |
| 2007/0156762 A1 | 7/2007 | Ben-Yaacov et al. |
| 2007/0162395 A1 | 7/2007 | Ben-Yaacov et al. |
| 2007/0167198 A1 | 7/2007 | Subramaniam et al. |
| 2007/0169115 A1 | 7/2007 | Ko et al. |
| 2007/0180063 A1 | 8/2007 | Qureshey et al. |
| 2007/0206827 A1 | 9/2007 | Tupman et al. |
| 2007/0214229 A1 | 9/2007 | Millington et al. |
| 2007/0217633 A1 | 9/2007 | Copeland et al. |
| 2007/0219953 A1 | 9/2007 | Mak |
| 2007/0220024 A1 | 9/2007 | Putterman et al. |
| 2007/0230723 A1 | 10/2007 | Hobson et al. |
| 2007/0232098 A1 | 10/2007 | Danner |
| 2007/0288678 A1 | 12/2007 | Langberg et al. |
| 2008/0013274 A1 | 1/2008 | Jobs et al. |
| 2008/0025172 A1 | 1/2008 | Holden et al. |
| 2008/0051160 A1 | 2/2008 | Seii et al. |
| 2008/0109306 A1 | 5/2008 | Maigret et al. |
| 2008/0123285 A1 | 5/2008 | Fadell et al. |
| 2008/0125031 A1 | 5/2008 | Fadell et al. |
| 2008/0156173 A1 | 7/2008 | Bauer |
| 2008/0188209 A1 | 8/2008 | Dorogusker et al. |
| 2008/0189390 A1 | 8/2008 | Heller et al. |
| 2008/0263020 A1 | 10/2008 | Takehara et al. |
| 2008/0273734 A1 | 11/2008 | Solland |
| 2009/0018682 A1 | 1/2009 | Fadell et al. |
| 2009/0058707 A1 | 3/2009 | Craze et al. |
| 2009/0076821 A1 | 3/2009 | Brenner et al. |
| 2009/0125609 A1 | 5/2009 | Wood et al. |
| 2009/0164473 A1 | 6/2009 | Bauer |
| 2009/0191732 A1 | 7/2009 | Fadell et al. |
| 2009/0254950 A1 | 10/2009 | Craigie et al. |
| 2009/0300508 A1 | 12/2009 | Krampf et al. |
| 2010/0081337 A1 | 4/2010 | Dorogusker et al. |
| 2010/0091997 A1 | 4/2010 | Tiwari et al. |
| 2010/0123834 A1 | 5/2010 | Brodersen et al. |
| 2010/0131567 A1 | 5/2010 | Dorogusker et al. |
| 2010/0188808 A1 | 7/2010 | Howarth et al. |
| 2010/0235739 A1 | 9/2010 | Rathi et al. |
| 2010/0287526 A1 | 11/2010 | Bumgarner et al. |
| 2011/0034121 A1 | 2/2011 | Ng et al. |
| 2011/0053491 A1 | 3/2011 | Bolton et al. |
| 2011/0053510 A1 | 3/2011 | Bolton et al. |
| 2011/0069433 A1 | 3/2011 | Krampf et al. |
| 2011/0070777 A1 | 3/2011 | Krampf et al. |
| 2011/0071658 A1 | 3/2011 | Krampf et al. |
| 2011/0078354 A1 | 3/2011 | Krueger et al. |
| 2011/0086551 A1 | 4/2011 | Novotney et al. |
| 2011/0113122 A1 | 5/2011 | Drope |
| 2012/0019371 A1 | 1/2012 | Vidal |
| 2012/0042094 A1 | 2/2012 | Qureshey et al. |
| 2012/0143729 A1 | 6/2012 | Qureshey et al. |
| 2015/0072612 A1 | 3/2015 | Qureshey et al. |
| 2015/0295553 A1 | 10/2015 | Qureshey et al. |

(56) References Cited

U.S. PATENT DOCUMENTS

| | | |
|---|---|---|
| 2016/0196101 A1 | 7/2016 | Qureshey et al. |
| 2019/0278560 A1 | 9/2019 | Krampf et al. |

FOREIGN PATENT DOCUMENTS

| | | | |
|---|---|---|---|
| DE | 44 10 741 A1 | 9/1994 | |
| DE | 44 32 589 A1 | 3/1996 | |
| DE | 195 21 057 A1 | 12/1996 | |
| EP | 0 129 286 B1 | 9/1987 | |
| EP | 0 464 482 A2 | 8/1996 | |
| EP | 0 899 889 A2 | 3/1999 | |
| EP | 0 982 947 A2 | 3/2000 | |
| EP | 1 030 517 A1 | 8/2000 | |
| EP | 1 061 490 A2 | 12/2000 | |
| EP | 1 093 103 A1 | 4/2001 | |
| EP | 1 150 444 A1 | 10/2001 | |
| EP | 1 170 743 A2 | 1/2002 | |
| EP | 0 870 176 A2 | 3/2003 | |
| EP | 1 310 073 A2 | 5/2003 | |
| EP | 3 849 884 A2 | 4/2004 | |
| EP | 1 371 044 A2 | 10/2004 | |
| EP | 1 378 102 A2 | 12/2005 | |
| EP | 1 550 037 A2 | 10/2006 | |
| EP | 1 341 316 A2 | 1/2007 | |
| EP | 1 345 341 A2 | 3/2008 | |
| EP | 2 019 351 A2 | 1/2009 | |
| EP | 2 026 546 A2 | 2/2009 | |
| EP | 1 929 638 B1 | 10/2009 | |
| EP | 2 107 685 A2 | 10/2009 | |
| GB | 2 290 429 A | 12/1995 | |
| GB | 2 308 512 A | 6/1997 | |
| WO | 1994/006084 A1 | 3/1994 | |
| WO | 1994/022242 A1 | 9/1994 | |
| WO | 00/77655 A1 | 12/2000 | |
| WO | 2000/077759 A1 | 12/2000 | |
| WO | 2001/027894 A1 | 4/2001 | |
| WO | 2001/086948 A2 | 11/2001 | |
| WO | 2001/092982 A2 | 12/2001 | |
| WO | 32/13429 A1 | 2/2002 | |
| WO | 2002/013487 A2 | 2/2002 | |
| WO | 2002/021247 A1 | 3/2002 | |
| WO | 2002/021248 A1 | 3/2002 | |
| WO | 2002/030087 A2 | 4/2002 | |
| WO | 2002/039406 A2 | 5/2002 | |
| WO | 2002/065732 A2 | 8/2002 | |
| WO | 2002/073975 A1 | 9/2002 | |
| WO | 2003/007597 A1 | 1/2003 | |
| WO | 2003/012579 A2 | 2/2003 | |
| WO | 2003/054678 A1 | 7/2003 | |
| WO | 2003/098901 A1 | 11/2003 | |
| WO | 2004/025901 A2 | 3/2004 | |
| WO | 2004/032515 A1 | 4/2004 | |
| WO | 2005/022377 A1 | 3/2005 | |
| WO | 2007/002229 A1 | 1/2007 | |
| WO | 2007/022297 A2 | 2/2007 | |
| WO | 2007/075376 A1 | 7/2007 | |

OTHER PUBLICATIONS

"Netlog Operating Instructions for the DLO Boom," Netalog, digital file created and last modified Mar. 9, 2005, downloaded Nov. 15, 2010 from http://a248.e.akamai.net/pix.crutchfield.com/Manuals/615/615IBOOM.PDF.

"IPort™ Announces Next Generation In-Wall iPod™ Docking Stations With Added Features, Including Two-Way RS232 Communication," Dana Innovations/Iport/Iportmusic.com press release dated Jun. 30, 2005, downloaded Nov. 15, 2010 from http://www.iportmusic.com/cms_pfs/media/press/Jun05_iPort_InWallLaunch_063005.pdf.

"IPort™ Makes Sharing iPod® Metadata More Than Just a Remote Possibility: AMX and Crestron Software Modules Now Available for iPort Music Systems," Dana Innovations/Iport/Iportmusic.com, press release dated Sep. 9, 2005, downloaded Nov. 15, 2010 from http://www.iportmusic.com/cms_pdfs/media/press/Port_NewModules_090905.pdf.

"Mp3 and More (Sep. 21, 2005) iPort Introduces Five New Free Standing iPod Music Systems Starting at $150 Retail that Make it Easier to Share Music and Photos throughout the Home," Top40-charts.com, webpage, downloaded and printed Nov. 15, 2010 from: http://top40-charts.com/news.php?nid=17236&string=Five.

"IPort Instruction Manual," Dana Innovations/Iport/Iportmusic. com, dated Sep. 2005, downloaded Nov. 16, 2010 from http://web.archive.org/web/20060701230502/http://www.iportmusic.com/downloads/iPort-FS_manual.pdf.

"Instruction Manual: Sonance iPort In-wall Docking System for iPod," Sonance, dated Mar. 2005, downloaded Nov. 16, 2010 from http://web.archive.org/web/20060813132149/www.sonance.com/image_data/downloads/iport_glb_im.pdf.

Mossberg, W. "Mating iPod and BMW Is a Brilliant Concept, But First Try Is Crude," WSJ.com, Aug. 5, 2005, downloaded and printed Nov. 16, 2010 from http://online.wsj.com/article/SB109165465318783124-search.html?KEYWORDS=Walter+Mossberg+BMW+iPod&COLLECTION=wsjie/6month.

Mossberg, W. The iPod Out Loud: Testing Speaker Attachments Separate Sound Systems for Digital Music Player Will Recharge Device, Too, WSJ.com, Apr. 13, 2005, downloaded and printed Nov. 16, 2010 from http://online.wsj.com/article/SB111334914292005250search.htmlKEYWORDS=Walter+Mossberg&COLLECTION=wsjie/6month.

Mossberg, W. "Gadget That 'Streams' Music Around House Is Terrific but Pricey," WSJ.com, Feb. 24, 2005, downloaded and printed Nov. 16, 2010 from http://online.wsj.com/article/SB110919542829162413-search.html?KEYWORDS=Walter+Mossberg+sonos&COLLECTION=wsjie/6month.

Horwitz, J. "Review: iHome iH5 Docking Stereo Clock Radio," iLounge.com, Jul. 26, 2005, downloaded and printed Nov. 17, 2010 from http://www.ilounge.com/index.php/reviews/entry/ihome-ih5-docking-stereo-clock-radio-ipod.

"AMX Transforms Modero Touch Panels to Support Next-Generation Digital Content Applications: New Touch Panels Surpass Every Control Interface on the Market Today; Equipped for Full-Rate Streaming Video, Audio and RGB/Component Video," AMX, press release Jun. 9, 2004, downloaded and printed Nov. 17, 2010 from http://www.amx.com/includes/pressrelease-file.asp?release=2004.06.09.b.

"AMX Reinvents DMS Keypad With Larger Screen, Exclusive New Interface for Optimal Performance: Mio Modero DMS Models Offer Pushbutton,Screen Touch and Slide Navigation Options," AMX, press release Sep. 9, 2005, downloaded and printed Nov. 17, 2010 from http://www.amx.com/includes/pressrelease-file.asp?release=2005.09.09.c.

"AMX Product Catalog," AMX, dated Oct. 2005, downloaded Nov. 17, 2010 from http://www.scribd.com/doc/11469149/Catalogo-Producto-AMX-2005.

Horwitz, J. "Review: DLO HomeDock for iPod," iLounge.com, Sep. 26, 2005, downloaded and printed Nov. 18, 2010 from http://www.ilounge.com/index.php/reviews/entry/dlo-homedock-for-ipod-ipod/.

Fuchs, A., et al., "End to End Content Delivery using UPnP and WiFi Networking," Connected Services in Mobile Networks—San Diego, CA, USA, Jan. 10-12, 2004, downloaded Nov. 20, 2010 from http://web.archive.org/web/20050512172544/www.simpledevices.com/CAL_IT_paperfinal.pdf.

Choy, H., et al., "Developing Innovative Devices Using Universal Plug and Play (UPnP)," SimpleDevices, Inc., Jan. 23, 2004, downloaded Nov. 20, 2010 from http://web.archive.org/web/20050514022434/www.simpledevices.com/Building InnovativeUPnPDevices.pdf.

NevoSL Brochure, Universal Electronics, Inc., digital file created Jan. 12, 2005, downloaded Nov. 20, 2010 from http://web.archive.org/web/20051102072551/www.mynevo.com/images/uploaded_images/NevoSL_brochure.pdf.

NevoSL Product Sheet, Universal Electronics, Inc, digital file created Sep. 20, 2005, downloaded Nov. 20, 2010 from http://web.archive.org/web/20051102074100/www.mynevo.com/images/uploaded_images/NevoSLProductSheet.pdf.

(56) References Cited

OTHER PUBLICATIONS

"NevoLink Product Sheet," Universal Electronics, Inc., digital file created Sep. 20, 2005, downloaded Nov. 20, 2010 from http://web.archive.org/web/20051124222911/www.mynevo.com/images/uploaded_images/NevoLinkProductSheet.pdf.
"UnivElectronics_OFA_kameleon8_manual," Universal Electronics, Inc., digital file created Aug. 15, 2003, last modified Aug. 23, 2003, downloaded Nov. 20, 2010 from http://web.archive.org/web/20050828115256/http://www.mykameleon.com/downloads/user_manuals/OFA_kameleon8_manual.pdf.
"Kameleon product brochure," Universal Electronics, Inc. digital file created Oct. 10, 2005, downloaded Nov. 22, 2010 from http://web.archive.org/web/20051025200607/www.vdveer.nl/sites/kameo/pages/cbuk.pdf.
Wilkinson, D., "Philips TSi6400 iPronto," Hometheater.com, Dec. 2003, downloaded and printed Nov. 22, 2010 from http://www.hometheater.com/accessories/1203philips/.
"Delphi SKYFi Installation Guide," Delphi, digital file created and last modified May 13, 2003, downloaded Nov. 30, 2010 from http://ppd.delphi.com/pdf/consumer/SKYFi_installation_guide.pdf.
"IPod Integration for PC: A Guide to Using FireBall with iTunes and iPod for PC Users," Escient, dated Jul. 18, 2005, downloaded Nov. 23, 2010 from http://web.archive.org/web/20051219170842/www.escient.com/support/supportdocuments/iPodIntegrationPC.pdf.
"Escient Fireball DVDM-300 User's Manual," Escient, digital file created Oct. 21, 2005, last modified Dec. 13, 2005, downloaded Nov. 23, 2010 from http://www.escient.com/manuals/FBDVDM300UM.pdf.
Luderback, J., "Mediabolic Unveils Network Media Player," PCMag.com, Feb. 15, 2005, downloaded and printed Nov. 18, 2010 from http://www.pcmag.eom/article2/0,2817,1765187,00.asp.
Julie, "Streamzap PC Remote Review," The Gadgeteer.com, May 6, 2003, downloaded and printed Nov. 18, 2010 from http://thegadgeteer.com/2003/05/06/streamzap_pc_remote_review/.
Notice of Allowance, dated Oct. 1, 2012, from co-pending U.S. Appl. No. 12/906,043.
Keyspan Express Remote Supports Apple's Airport Express, Press Release, Keyspan, Nov. 10, 2004, Keyspan-Express-Remote-News-Press-Release.pdf.
Keyspan Express Remote 15T, 11 Product Fact Sheet, Keyspan, Nov. 2004. Keyspan-Remote-for-iTunes-URM15T-product-sheet.pdf.
Keyspan: DMR Software v1.3 for Mac OS X-User Manual, rev. 04.09.01A1, Keyspan. Keyspan-DMRforX13.pdf.
Keyspan Express Remote Supports Apple's Airport Express, Press Release, Keyspan, Nov. 10, 2004. Keyspan-Express-Remote-Supports-Apples-Airport-Express.pdf.
Salling Clicker 2.2.1, User Manual, Sailing Software AB, 2005.—manual for 2.2.1 (downloaded from http://web.archive.org/web/20050715080116/http://shareware.salling.com/Downloads/SallingClicker_UserManual.pdf.
Mini Hi-Fi Component System—Operating Instructions, Sony Corporation, 1997, pp. 1-71.
Express Remote (URM-17 A), product information datasheet, Keyspan, http://www.keyspan.com/products/usb/urm15t, pp. 1-2. downloaded fromhttp://web.archive.org/web/20050923195754/www.keyspan.com/products/usb/urm17a/docurl or http://web.archive.org/web/20050923195754/http://www.keyspan.com/products/usb/urm 17a/mktgfiles/URM17A_v1d.pdf.
XtremeMac-IPD-LUN-00-Luna-Alarm-Clock-Audio-System-with-iPod-Dock. pdf Printed from http://www.amazon.com/XtremeMac-IPD-LUN-OO-Alarm-Clock-System/dp/BOOOKVSCQI.
http://xtrememac.com/audio/speakers/luna/features.php.
U.S. Appl. No. 11/363,649, Hobson.
IPR Proceeding IPR2015-01463, "Exhibit 1004: Mercer C.V.", 21 pages, submitted Jun. 30, 2015, file name: IPR2015-01463-IPR-of-US-Patent-No.-8090309-Exhibit-1004-Mercer-CV-06-30-2015.pdf.
IPR Proceeding IPR2016-00794, "Petition for IPR of U.S. Pat. No. 8,090,309", 65 pages, submitted Mar. 25, 2016, file name: IPR2016-00794-IPR-of-US-Patent-No-8090309-Petition-for-IPR-of-US-Patent-No-8090309-03-25-2016.pdf.
IPR Proceeding IPR2016-00794, "Petitioners Reply to Patent Owners Response", 32 pages, submitted Jan. 23, 2017, file name: IPR2016-00794-IPR-of-US8090309-Petitioners-Reply-To-Patent-Owners-Response-paper-20-01-23-2017.pdf.
IPR Proceeding IPR2016-00794, "Record of Oral Hearing", 81 pages, submitted Jul. 11, 2017, file name: IPR2016-00794-IPR-of-US-Patent-No-8090309-Record-of-Oral-Hearing-paper-31-07-11-2017.pdf.
IPR Proceeding IPR2016-00794, "Exhibit 1018—Petitioners Demonstratives", 69 pages, submitted Apr. 19, 2017, file name: IPR2016-00794-IPR-of-US-Patent-No-8090309-Petitioner-Demonstratives-Exhibit-1018-04-19-2017.pdf.
IPR Proceeding IPR2016-00794, "Patent Owner's Preliminary Response", 64 pages, submitted Jun. 28, 2016, file name: IPR2016-00794-IPR-of-US8090309-Patent-Owners-Preliminary-Response-paper-8-06-28-2016.pdf.
IPR Proceeding IPR2016-00794, "Petitioners Objections to Admissibility of Evidence", 4 pages, submitted Dec. 1, 2016, file name: IPR2016-00794-IPR-of-US8090309-Petitioners-Objs-to-Admissibility-of-Evidence-paper-15-12-01-2016.pdf.
IPR Proceeding IPR2016-00794, "Petitioners Objections to Admissibility of Evidence", 4 pages, submitted Oct. 17, 2016, file name: IPR2016-00794-IPR-of-US8090309-Petitioners-Obj-to-Admissibility-of-Evidence-paper-111-10-17-2016.pdf.
IPR Proceeding IPR2016-00794, "Petitioners Objections to Admissibility of Evidence", 5 pages, submitted Dec. 14, 2016, file name: IPR2016-00794-IPR-of-US8090309-Petitioners-Obj-to-Admissibility-of-Evidence-paper-19-12-14-2016.pdf.
IPR Proceeding IPR2016-00794, "Petitioners Motion to Exclude", 18 pages, submitted Mar. 16, 2017, file name: IPR2016-00794-IPR-of-US-Patent-No-8090309-Petitioners-Motion-to-Exclude-paper-23-03-16-2017.pdf.
IPR Proceeding IPR2016-00794, "Exhibit 1004: Mercer C.V.", 21 pages, submitted Mar. 26, 2016, file name: IPR2016-00794-IPR-of-US8090309-Mercer-CV-Exhibit-1004-03-25-2016.pdf.
IPR Proceeding IPR2016-00794, "Exhibit 1003: Mercer Declaration", 53 pages, submitted Mar. 25, 2016, file name: IPR2016-00794-IPR-of-US8090309-Exhibit-1003-Mercer-Declaration-03-25-2016.pdf.
IPR Proceeding IPR2016-00794, "Exhibit 2016", 2 pages, submitted Dec. 8, 2016, file name: IPR2016-00794-IPR-of-US8090309-Exhibit-2016-12-08-2016.pdf.
IPR Proceeding IPR2016-00794, "Exhibit 2006: Ko, U.S. Pat. No. 7,702,279", 18 pages, submitted Dec. 6, 2016, file name:IPR2016-00794-IPR-of-US8090309-Ex-2006-Ko-US702279-12-06-2016.pdf.
IPR Proceeding IPR2016-00794, "Exhibit 2007: Mercer Deposition", 48 pages, submitted Dec. 8, 2016, file name: IPR2016-00794-IPR-of-US8090309-Mercer-Depo-11-11-2016-Exhibit-2007-12-08-2916.pdf.
IPR Proceeding IPR2016-00794, "Patent Owners Response", 46 pages, submitted Dec. 8, 2016, file name: IPR2016-00794-IPR-of-US8090309-Patent-Owners-Response-paper-16-12-08-2016.pdf.
IPR Proceeding IPR2016-00794, "Notice of Trial Instituted", 24 pages, submitted Sep. 23, 2016, file name: IPR2016-00794-IPR-of-US8090309-Trial-Instituted-Document-paper-9-09-23-2016.pdf.
IPR Proceeding IPR2016-00794, "Exhibit 1001: U.S. Pat. No. 8,090,309", 36 pages, submitted Mar. 25, 2016, file name: IPR2016-00794-IPR-of-US8090309-Krampf-US8090309-Ex-1001-03-25-2016-reduced.pdf, 36 pages.
IPR Proceeding IPR2016-00794, "Exhibit 1002: File History of U.S. Pat. No. 8,090,309", 327 pages, submitted Mar. 25, 2016, file name: IPR2016-00794-IPR-of-US8090309-Krampf-FH-US-8090309-Ex-1002-03-25-2016.pdf.
IPR Proceeding IPR2016-00794, "Exhibit 2008: Review: Chestnut Hill Sound George", from MacWorld, Aug. 17, 2007, 7 pages, submitted Dec. 8, 2016, file name: IPR2016-00794-IPR-of-US8090309-Review-CHS-George-published-08-17-2007-MacWorld-Ex-2008-12-08-2016.pdf.

(56) References Cited

OTHER PUBLICATIONS

IPR Proceeding IPR2016-00794, "Exhibit 2009: Chestnut Hill Sound George Review & Rating", from PCMag, Jan. 29, 2007, 25 pages, submitted Dec. 8, 2016, file name: IPR2016-00794-IPR-of-US8090309-Review-CHS-George-PCMag-01-29-2007-Ex-2009-12-08-2016.pdf.
IPR Proceeding IPR2016-00794, "Petitioners Objections to Patent Owners Demonstrative Exhibits", 4 pages, submitted Apr. 17, 2017, file name: IPR2016-00794-IPR-of-US8090309-Petitioners-Obj-to-POs-Demonstrative-Exs-Paper-27-04-17-2017.pdf.
IPR Proceeding IPR2016-00794, "Patent Owner's Response to Petitioner's Motion to Exclude", 18 pages, submitted Mar. 30, 2017, file name: IPR2016-00794-IPR-of-US8090309-POs-Response-To-Petitioners-Motion-To-Exclude-paper-24-03-30-2017.pdf.
IPR Proceeding IPR2016-00794, "Patent Owner's Notice of Appeal", 5 pages, submitted Nov. 6, 2017, file name: IPR2016-00794-IPR-of-US-Patent-No.-8090309-Patent-Owners-Notice-of-Appeal-paper-33-Nov. 6, 2017.pdf, 5 pages.
IPR Proceeding IPR2016-00794, "Exhibit 2014: *Chestnut Hill Sound* v. *Apple*, First Amended Complaint", 11 pages, submitted Dec. 8, 2016, file name: IPR2016-00794-IPR-US8090309-CHS-v-Apple-First-Amended-Complaint-Exhibit-2014-12-08-2016.pdf.
IPR Proceeding IPR2016-00794, "Exhibit 2012: Decision Denying Institution in IPR2015-01464", 21 pages, submitted Dec. 8, 2016, file name: IPR2016-00794-IPR-US8090309-Decision-Denying-Institution-in-IPR2015-01464-Ex-2012-12-08-2016.pdf.
IPR Proceeding IPR2016-00794, "Exhibit 2011: Decision Denying Institution in IPR2015-01463", 23 pages, submitted Dec. 8, 2016, file name: IPR2016-00794-IPR-US8090309-Decision-Denying-Institution-IPR2015-01463-Exhibit-2011-12-08-2016.pdf.
IPR Proceeding IPR2016-00794, "Exhibit 2015", 3 pages, submitted Dec. 8, 2016, file name: IPR2016-00794-IPR-of-US8090309-Exhibit-2015-12-08-2016.pdf.
IPR Proceeding IPR2016-00794, "Exhibit 2014", 2 pages, submitted Dec. 8, 2016, file name: IPR2016-00794-IPR-US8090309-CHS-v-Apple-Ex-1-CHS-Press-Release-Ex-2014-12-08-2016.
IPR Proceeding IPR2016-00794, "Exhibit 2017: Patent Owner Demonstratives Exhibit", 61 pages, submitted Apr. 18, 2017, file name: IPR2016-00794-IPR-of-US-Patent-No-8090309-Patent-Owner-Demonstratives-Exhibit-2017-04-18-2017.pdf.
IPR Proceeding IPR2015-01464, "Exhibit 2005: Microsoft Computer Dictionary", 5 pages, submitted Oct. 23, 2015, file name: IPR2015-01464-IPR-of-US8725063-Ex-2005-Microsoft-Computer-Dictionary-10-23-2015.pdf.
IPR Proceeding IPR2015-01464, "Exhibit 2001", 21 pages, submitted Oct. 23, 2015, file name: IPR2015-01464-IPR-of-US8725063-Ex-2001-CHS-Exs-1-2-and-4-to-DI-9-Opening-Brief-Support-Motion-PI.pdf.
IPR Proceeding IPR2015-01464, "Exhibit 1001: U.S. Pat. No. 8,725,063", 36 pages, submitted Dec. 8, 2016, file name: IPR2015-01464-IPR-of-US8725063-Exhibit-1001-US8725063-07-01-2015-A.pdf and-B.pdf.
IPR Proceeding IPR2015-01464, "Exhibit 2004: Websters II New Riverside Dictionary", 4 pages, submitted Oct. 23, 2015, file name: IPR2015-01464-IPR-of-US8725063-Ex-2004-Websters-II-New-Riverside-Dictionary-10-23-2015.pdf.
IPR Proceeding IPR2015-01464, "Exhibit 1004: Mercer C.V.", 5 pages, submitted Jul. 1, 2015, file name: IPR2015-01464-IPR-of-US8725063-Exhibit-1004-Mercer-CV-7-01-2015.pdf.
IPR Proceeding IPR2015-01464, "Decision Denying Institution of IPR", 19 pages, submitted Jan. 13, 2016, file name: IPR2015-01464-IPR-of-US8725063-Decision-Denying-Institution-of-IPR-Paper-10-01-13-2016.pdf.
IPR Proceeding IPR2015-01464, "Petition for Inter Partes Review", 53 pages, submitted Jul. 1, 2015, file name: IPR2015-01464-IPR-of-US8725063-Petition-For-Inter-Partes-Review-Filed-07-01-2015.pdf.
IPR Proceeding IPR2015-01464, "Exhibit 1002: File History of U.S. Pat. No. 8,725,063—Part 1", 370 pages, submitted Jul. 1, 2015, file name: IPR2015-01464-IPR-of-US8725063-Ex-1002-FH-US-8725063-Part-1-07-01-2015.pdf, 370 pages.
IPR Proceeding IPR2015-01464, "Patent Owner's Preliminary Response", 54 pages, submitted Oct. 23, 2015, file name: IPR2015-01464-IPR-of-US8725063-Patent-Owners-Preliminary-Response-Filed-10-23-2015.pdf.
IPR Proceeding IPR2015-01464, "Exhibit 1002: File History of U.S. Pat. No. 8,725,063—Part 2", 373 pages, submitted Jul. 1, 2015, file name: IPR2015-01464-IPR-of-US8725063-Ex-1002-FH-US-8725063-Part-2-07-01-2015.pdf.
IPR Proceeding IPR2015-01464, "Exhibit 1003: Mercer Declaration", 62 pages, submitted Jul. 1, 2015, file name: IPR2015-01464-IPR-of-US8725063-Exhibit-1003-Mercer-Declaration-07-01-2015.pdf.
IPR Proceeding IPR2015-01465, "Final Written Decision", 50 pages, submitted Jan. 10, 2017, file name: IPR2015-01465-IPR-of-US-patent-8725063-Final-Written-Decision-paper-39-01-10-2017.pdf.
IPR Proceeding IPR2015-01465, "Exhibit 2101", 21 pages, submitted , file name:IPR2015-01465-IPR-of-US8725063-Ex-2101-CHS-Exs-1-2-and-4-to-DI-9-Opening-Brief-Support-Motion-PI.pdf, 21 pages.
IPR Proceeding IPR2015-01465, "Exhibit 2109: Wigdor Declaration", 27 pages, submitted Apr. 13, 2016, file name: IPR2015-01465-IPR-of-US-patent-8725063-Ex-2109-Wigdor-Declaration-signed.pdf.
IPR Proceeding IPR2015-01465, "Exhibit 2111: Microsoft Office Vision 2003 Inside Out", 863 pages, submitted Apr. 13, 2016, file name: IPR2015-01465-IPR-of-US-patent-8725063-Ex-2111-msvisio2003-inside-out.pdf.
IPR Proceeding IPR2015-01465, "Exhibit 2112: The Chambers Dictionary (2003)—mode", 3 pages, submitted Apr. 13, 2016, file name:IPR2015-01465-IPR-of-US-patent-8725063-Ex-2112-Chambers-Dictionary-Mode.pdf.
IPR Proceeding IPR2015-01465, "Record of Oral Hearing", 88 pages, submitted Nov. 8, 2016, file name: IPR2015-01465-IPR-of-US-patent-8725063-paper-38-record-of-oral-hearing-11-08-2016.pdf.
IPR Proceeding IPR2015-01465, "Exhibit 2113: The Chambers Dictionary—select and selectively", 3 pages, submitted Apr. 13, 2016, file name: IPR2015-01465-IPR-of-US-patent-8725063-Ex-2113-Chambers-Dictionary-Select-and-Selectively-04-13-2016.pdf.
IPR Proceeding IPR2015-01465, "Petitioners Objections to Evidence—paper 17", 4 pages, submitted Jan. 28, 2016, file name: IPR2015-01465-IPR-of-US-patent-8725063-Petitioners-Objections-To-Evidence-paper-17-01-2-2016.pdf.
IPR Proceeding IPR2015-01465, "Petitioners Objections to Evidence—paper 23", 6 pages, submitted Apr. 13, 2016, file name: IPR2015-01465-IPR-of-US-patent-8725063-Petitioners-Objections-To-Evidence-paper-23-04-20-2016.pdf.
IPR Proceeding IPR2015-01465, "Patent Owner's Objections to Evidence—paper 16", 4 pages, submitted Jan. 28, 2016, file name: IPR2015-01465-IPR-of-US-patent-8725063-Patent-Owners-Objections-To-Evidence-paper-16-01-28-2016.
IPR Proceeding IPR2015-01465, "Patent Owner's Reponse—paper 21", 65 pages, submitted Apr. 13, 2016, file name: IPR2015-01465-IPR-of-US-patent-8725063-Patent-Owners-Response-FINAL-paper-21-04-13-2016.pdf.
IPR Proceeding IPR2015-01465, "Exhibit 2117: Patent Owner's Demonstrative Exhibits", 61 pages, submitted Oct. 6, 2016, file name: IPR2015-01465-IPR-of-US-patent-8725063-Ex-2117-Patent-Owners-Demonstrive-Exhibits-10-06-2016.pdf.
IPR Proceeding IPR2015-01465, "Exhibit 2102: U.S. Pat. No. 8,725,063", 36 pages, submitted Oct. 23, 2015, file name: IPR2015-01465-IPR-of-US-patent-8725063-Ex-2102-US-Patent-8725063-10-23-2015-A.pdf and-B.pdf.
IPR Proceeding IPR2015-01465, "Exhibit 2103: Prosecution History of '063 Patent—Part 1", 364 pages, submitted Oct. 23, 2015, file name: IPR2015-01465-IPR-of-US-8725063-Ex-2103-Prosecution-History-of-063-Patent-Part1-10-23-2015-reduced.pdf.
IPR Proceeding IPR2015-01465, "Exhibit 2103: Prosecution History of '063 Patent—Part 2", 386 pages, submitted Oct. 23, 2015,

(56) References Cited

OTHER PUBLICATIONS file name: IPR2015-01465-IPR-of-US-8725063-Ex-2103-Prosecution-History-of-063-Patent-Part2-10-23-2015-reduced.pdf.
IPR Proceeding IPR2015-01465, "Exhibit 2114: Yamaha AV receiver product manual", 95 pages, submitted Apr. 13, 2016, file name: IPR2015-01465-IPR-of-US-patent-8725063-Ex-2114-Yamaha-RX-V1.pdf.
IPR Proceeding IPR2015-01465, "Exhibit 1003: Mercer Declaration", 62 pages, submitted Jul. 1, 2015, file name: IPR2015-01465-IPR-of-US-patent-8725063-Exhibit-1003-Mercer-Declaration-07-01-2015.pdf.
IPR Proceeding IPR2015-01465, "Exhibit 1004: Mercer CV", 21 pages, submitted Jul. 1, 2015, file name: IPR2015-01465-IPR-of-US-patent-8725063-Exhibit-1004-Mercer-CV-07-01-2015.pdf.
IPR Proceeding IPR2015-01465, "Exhibit 1016: Wigdor Deposition Transcript", 31 pages, submitted Aug. 10, 2016, file name: IPR2015-01465-IPR-of-US-patent-8725063-Ex-1016-Wigdor-Deposition-Transcript-08-10-2016.pdf.
IPR Proceeding IPR2015-01465, "Patent Owner's Objections to Evidence—paper 29", 4 pages, submitted Jan. 28, 2016, file name: IPR2015-01465-IPR-of-US-patent-8725063-Patent-Owners-Objections-to-Evidence-paper-29-08-17-2016, 4 pages.
IPR Proceeding IPR2015-01465, "Patent Owner's Notice of Appeal—paper 42", 5 pages, submitted Mar. 13, 2017, file name: IPR2015-01465-IPR-of-US-patent-8725063-Patent-Owners-Notice-of-Appeal-PAPER-42-03-13-2017.pdf.
IPR Proceeding IPR2015-01465, "Petition for Inter Partes Review", 51 pages, submitted Jul. 1, 2015, file name: IPR2015-01465-IPR-of-US-patent-8725063-Petition-for-Inter-Partes-Review-Paper-2-07-01-2015.pdf.
IPR Proceeding IPR2015-01465, "Patent Owner's Preliminary Response—paper 8", 54 pages, submitted Oct. 23, 2015, file name: IPR2015-01465-IPR-of-US-8725063-Patent-Owners-Preliminary-Response-paper-8-10-23-2015.pdf.
IPR Proceeding IPR2015-01465, "Exhibit 2110: Wigdor C.V.", 24 pages, submitted Apr. 13, 2016, file name: IPR2015-01465-IPR-of-US-patent-8725063-Ex-2110-D-Wigdor-CV.pdf.
IPR Proceeding IPR2015-01465, "Exhibit 2104: Websters II New Riverside Dictionary", 4 pages, submitted Oct. 23, 2015, file name: IPR2015-01465-IPR-of-US-8725063-Ex-2104-Websters-II-New-Riverside-Dictionary-at-614-1996.pdf.
IPR Proceeding IPR2015-01465, "Decision Granting Institution—paper 14", 29 pages, submitted Jan. 13, 2016, file name: IPR2015-01465-IPR-of-US-patent-8725063-Decision-Granting-Institution-paper-14-01-13-2016.pdf.
IPR Proceeding IPR2015-01465, "Exhibit 1023: Petitioner Demonstratives", 74 pages, submitted Oct. 7, 2016, file name: IPR2015-01465 IPR of U.S. Pat. No. 8,725,063 Exhibit 1023 Petitioner Demonstratives Oct. 7, 2016.pdf.
IPR Proceeding IPR2015-01465, "Exhibit 2116: Statutory Disclaimer", 8 pages, submitted Sep. 21, 2016, file name: IPR2015-01465-IPR-of-US-patent-8725063-Exhibit-2116-Statutory-Disclaimer-9-21-2016.pdf.
IPR Proceeding IPR2015-01465, "Exhibit 1022: IBM dictionary definition of file", 4 pages, submitted Oct. 6, 2016, file name: IPR2015-01465-IPR-of-US-patent-8725063-Exhibit-1022-IBM-dictionary-Definition-of-File-10-06-2016.pdf.
IPR Proceeding IPR2015-01465, "Paper 28: Petitioner's Reply to Patent Owner's Response", 34 pages, submitted Aug. 10, 2016, file name: IPR2015-01465-IPR-of-US-8725063-Petitioners-Reply-To-Patent-Owners-Response-paper-28-08-10-2016.pdf.
IPR Proceeding IPR2015-01465, "Exhibit 2115: Mercer Deposition Transcript", 151 pages, submitted Apr. 13, 2016, File name: IPR2015-01465-IPR-of-US-8725063-Ex-2115-Mercer-Deposition-04-05-2016-Transcript-04-13-2016.pdf.
IPR Proceeding IPR2015-01465, "Paper 10: Motion to Correct and Appendices, Part 1", 399 pages, submitted Oct. 15, 2015, file name: IPR2015-01465-IPR-of-US-8725063-Motion-to-Correct-and-Appendices-Part-1-paper-10-10-28-2015-A.pdf and -B.pdf.
IPR Proceeding IPR2015-01465, "Paper 11 Motion to Correct and Appendices, Part 2", 391 pages, submitted Oct. 15, 2015, file name: IPR2015-01465-IPR-of-US-8725063-Motion-to-Correct-and-Appendices-Part-2-paper-11-10-28-2015.pdf.
IPR Proceeding IPR2015-01464, "Final Written Decision", 43 pages, submitted Sep. 5, 2017, file name: IPR2016-00794-IPR-of-US-patent-8090309-Final-Written-Decision-09-05-2017.pdf.
Appeal 17-1808 (Fed. Cir.), "Document 31: Joint Appendix, vol. I of II", 158 pages, submitted Sep. 26, 2017, file names: CAFC-Case-17-1808-Joint-Appendix-Volume-I-of-II-Document-31-1-Filed-09-26-2017-A.pdf and -B reduced.pdf.
Appeal 18-1163 (Fed. Cir.), "Document 1: Notice of Docketing", 49 pages, submitted Nov. 7, 2017, file name: CAFC-Case-1 8-1163-Notice-of-Docketing-Notice-of-Appeal-Documents-1-1-1-2-Filed-11-07-2017.pdf.
Appeal 18-1163 (Fed. Cir.), "Document 12: Certified List", 52 pages, submitted Dec. 19, 2017, file name:CAFC-Case-18-1163-Certified-List-Document-12-Filed-12-19-2017.pdf.
Appeal 17-1808 (Fed. Cir.), "Document 11: Certified List", 60 pages, submitted Apr. 26, 2017, file name: CAFC-Case-17-1808-Certified-List-Document-11-04-26-2017.pdf.
Appeal 17-1808 (Fed. Cir.), "Document 19: Corrected Brief of Appellant, Chestnut Hill Sound, Inc.", 140 pages, submitted Jul. 21, 2017, file name: CAFC-Case-17-1808-Corrected-Brief-Appellant-Chestnut-Hill-Sound-Inc-Document-19-Filed-07-21-2017.pdf.
Appeal 17-1808 (Fed. Cir.), "Document 22: Responsive Brief for Appellee", 55 pages, submitted Aug. 21, 2017, file name: CAFC-Case-17-1808-Responsive-Brief-For-Appellee-Document-22-Filed-09-21-2017.pdf.
Appeal 17-1808 (Fed. Cir.), "Document 1: Notice of Docketing", 58 pages, Mar. 17, 2017, file name: CAFC-Case-17-1808-Notice-of-Docketing-Notice-of-Appeal-Documents-1-1-1-2-Filed-03-17-2017.pdf.
Appeal 17-1808 (Fed. Cir.), "Document 31: Joint Appendix vol. II of II", 166 pages, submitted Sep. 26, 2017, file names: CAFC-Case-17-1808-Joint-Appendix-Volume-II-of-II-Document-31-2-Filed-09-26-2017-A.pdf and -B.pdf.
PCT Publication of International Search Report in corresponding application PCT Application PCT/US2006/032029, dated Feb. 15, 2007.
PCT Written Opinion from corresponding Patent Application No. PCT/US2006/032029, dated Feb. 16, 2008.
Response to Non-Final Office Action dated May 5, 2011, issued in related U.S. Appl. No. 12/906,052, Response filed Sep. 20, 2011 including 1.131 petition and supporting affidavits and related exhibits.
Intention to Grant received for EP Patent Application Serial No. 06801654.2 dated Mar. 16, 2009, 54 pages.
Notice of Allowance received for U.S. Appl. No. 12/906,047 dated Aug. 12, 2014, 34 pages.
Notice of Allowance received for U.S. Appl. No. 14/243,915 dated Sep. 21, 2015, 16 pages.
Non-Final Office Action received for U.S. Appl. No. 14/944,789 dated Jul. 16, 2018, 7 pages.
Notice of Allowance received for U.S. Appl. No. 14/944,789 dated Feb. 12, 2018, 33 pages.
Notice of Allowance received for U.S. Appl. No. 14/944,789 dated Dec. 12, 2018, 12 pages.
Non-Final Office Action received for U.S. Appl. No. 15/844,982 dated Mar. 8, 2018, 39 pages.
Notice of Allowance received for U.S. Appl. No. 15/844,982 dated Sep. 12, 2018, 32 pages.
Notice of Allowance received for U.S. Appl. No. 12/906,033 dated Feb. 3, 2014, 12 pages.
Non-Final Office Action received for U.S. Appl. No. 12/906,038 dated Dec. 7, 2012, 34 pages.
Final Office Action received for U.S. Appl. No. 12/906,038 dated Apr. 24, 2013, 17 pages.
Commmunication pursuant to Article 94 (3) EPC received for EP Patent Application Serial No. 06801654.2 dated Jun. 26, 2008, 3 pages.
Digital Living Network Alliance (DLNA), "Use Case Scenarios : White Paper", Jun. 2004, pp. 1-15.

(56) References Cited

OTHER PUBLICATIONS

Frakes, Dan, "Review: Alpine KCA-420i iPod Interface," www.macworld.com, Sep. 26, 2004, http://www.macworld.com/article/39521/2004/09/alpineipod.html.
"Alpine KCA-420i Interface Adapter for iPod™ Product Technical Guide", Alpine Electronics, digital file revised Sep. 24, 2004, downloaded Oct. 30, 2010 from http://web.archive.org/web/20041208224835/http://www.alpine-usa.com/images/products/product_downloads_pdf/kca-420i_ptg.pdf.
"Alpine KCA-420i Interface Adapter for iPod™ Owners Manual", Alpine Electronics, digital file created Jul. 2, 2004, last modified Sep. 22, 2004, downloaded Oct. 30, 2010 from http://web.archive.org/web/20041208224835/http://www.alpine-usa.com/images/products/product_downloads_pdf/kca-420i_om.pdf.
"Alpine Debuts World's First Car Audio Head Units That Allow True Integration With iPod," Alpine Electronics, press release dated Jan. 6, 2004, published on website Jan. 8, 2004, downloaded and printed Oct. 30, 2010 from http://www.alpine-usa.com/company/press/2004/alpine-debuts-worlds-first-car-audio-head-units-that-allow-true-inegration-with-ipod/.
"Alpine Ships In-Vehicle Connectivity Solution For iPOD," Alpine Electronics, press release dated Sep. 28, 2004, published on website Sep. 28, 2004, downloaded and printed Oct. 30, 2010 from http://www.alpine-usa.com/company/press/2004/alpine-ships-in-vehicle-connectivity-solution-for-ipod/.
"The Best In-Vehicle Solution for Your iPod® Alpine iPod Interface, KCA-420i," Alpine Electronics, web page, Dec. 8, 2004, downloaded and printed Oct. 30, 2010 from http://web.archive.org/web/20041208224835/www.alpine-usa.com/products/leading_technology/leading_tech_kca-420i.htm.
Cabell, T., "Apple's iPod™ Hits the Road with Alpine: Is Alpine's KCA-420i iPod Interface Adapter the best in-car iPod solution yet?" web page, Oct. 5, 2004, www.crutchfield.com, downloaded and printed Nov. 2, 2010 from http://www.crutchfield.com/learn/reviews/20040914/alpine_ipod.html.
"When you touch it, It touches you back! IVA-D300 (DVD/CD/MP3/WMA Receiver/Mobile Multimedia Station)," Alpine Electronics, web page, Dec. 8, 2004, downloaded and printed Nov. 4, 2010 from http://web.archive.org/web/20041208224301/www.alpine-usa.com/products/leading_technology/leading_tech_iva-d300.htm.
"Alpine IVA-D300 Product Description," Alpine Electronics, web page, Apr. 7, 2005, downloaded and printed Nov. 4, 2010 from http://web.archive.org/web/20050407085049/http://iweb.alpine-usa.com/pls/admn/subcategory_info?o_subcategory=50&p_category=10&p_main=10.
"Alpine IVA-D300 Product Technical Guide," Alpine electronics, digital file created and last modified Apr. 26, 2004, downloaded Oct. 30, 2010 from http://web.archive.org/web/20041117094146/http://www.alpine-usa.com/.
"Alpine Mobile Multimedia Station IVA-D300—Owners Manual", Alpine Electronics, digital file created Mar. 1, 2004, last modified Apr. 7, 2004, downloaded Oct. 30, 2010 from http://web.archive.org/web/20041208224301/http://www.alpine-usa.com/images/products/product_downloads_pdf/iva-d300_om.pdf.
"Creative Expands Portable Speakers Family By Introducing Travelsound and Traveldock," Creative Technology Ltd., press release dated Jan. 9, 2005, downloaded and printed Nov. 5, 2010 from http://web.archive.org/web/20051205153811/www.creative.com/press/releases/welcome.asp?pid=12185.
"Creative Announces the l-Trigue L3800 Speaker System That Includes Wireless Remote to Control Zen MP3 Players," Creative Technology Ltd., press release dated Oct. 19, 2005, downloaded and printed Nov. 5, 2010 from http://web.archive.org/web/20061018104700/www.creative.com/press/releases/welcome.asp?pid=12233.
"Creative TravelDoc Zen Micro," Creative Technologies, Ltd., web page, downloaded and printed Nov. 5, 2010 from http://web.archive.org/web/20051204093556/www.creative.com/products/product.asp?category=4&subcategory=29&product=11784 and linked from http://web.archive.org/web/20051205153811/www.creative.com/press/releases/welcome.asp?pid=12185, which contains a press release dated Jan. 9, 2005.
"Creative TravelDoc 900," Creative Technologies, Inc. web page, downloaded and printed Nov. 5, 2010 from http://web.archive.org/web/20051205163558/www.creative.com/products/product.asp?category=4&subcategory=29&product=14055 and linked from http://web.archive.org/web/20051205153811/www.creative.com/press/releases/welcome.asp?pid=12185 which contains a press release dated Jan. 9, 2005.
"Creative I-Trigue L3800," Creative Technologies, Inc. web page, downloaded and printed Nov. 5, 2010 from http://web.archive.org/web/20061018092458/www.creative.com/products/product.asp?category=4&subcategory=27&product=14097 and linked from (press release) http://web.archive.org/web/20061018104700/www.creative.com/press/releases/welcome.asp?pid=12233.
"Creative Wireless Remote I200," Creative Technologies, Inc., downloaded and printed Nov. 5, 2010 from http://web.archive.org/web/20070513183628/www.creative.com/products/product.asp?category=4&subcategory=30&product=14565 and linked from ITrigue L3800 page http://web.archive.org/web/20061018092458/www.creative.com/products/product.asp?category=4&subcategory=27&product=14097.
Ricker, T., "Crestron CEN-IPOD replicates the iPod interface on a touchpanel," dated Sep. 13, 2005, Engadget.com web page, downloaded and printed Nov. 6, 2010 from http://www.engadget.com/2005/09/13/creston-cen-ipod-replicates-the-ipod-interface-on-a-touchpanel/.
"Niles Audio Intellipad," Niles Audio, web page, Jun. 17, 2005, downloaded and printed Nov. 9, 2010, from http://web.archive.org/web/20050617025156/www.nilesaudio.com/products/intellipad.html.
"CNET editors' review, Sonos Digital Music System (ZP100 bundle)," CNET.com, Feb. 14, 2005, downloaded and printed Nov. 6, 2010 from http://reviews.cnet.com/digital-audio-receivers-dars/sonos-digital-music-system/1707-6470_7-31201699.html.
"Roku SoundBridge Network Music Player Now Ships with Free Wi-Fi," Roku press release, Aug. 27, 2004, downloaded Nov. 10, 2010 from http://soundbridge.roku.com/press_news/082704_press_release.pdf.
"Roku Rolls Out New Low Cost SoundBridge M500," Roku press release, Dec. 8, 2004, downloaded Nov. 10, 2010 from http://soundbridge.roku.com/press_news/120804_press_release.pdf.
"Roku SoundBridge Gets Free Software Update: Now Plays Digital Music from RealNetworks' Rhapsody Service," Roku press release Dec. 31, 2004, downloaded Nov. 10, 2010 from http://soundbridge.roku.com/press_news/123104_press_release.pdf.
"Roku Announces Embedded SoundBridge Network Music Module: OEMs Can Easily Integrate Digital Music and Intenet Radio Features Into New Consumer Electronics Products," Roku press release Jan. 6, 2005, downloaded Nov. 10, 2010 from http://soundbridge.roku.com/press_news/010605_press_release.pdf.
"Roku Introduces SoundBridge Radio: Complete Wi-Fi Music System Combines Ease-of-Use of a High-Quality Tabletop Radio with Digital Music Streaming and Internet Radio Features," Roku press release Sep. 19, 2005, downloaded Nov. 10, 2010 from http://soundbridge.roku.com/press_news/09190_press_release.pdf.
"Sonos ZP100 Spec Sheet," Sonos, Inc., digital file created and last modified Apr. 22, 2005, downloaded Aug. 16, 2010 from http://web.archive.org/web/20051125171052/www.sonos.com/documents/Sonos_Spec_Sheet.pdf.
"Sonos ZonePlayer—a networked digital audio player," Sonos, Inc., web page, downloaded and printed Aug. 16, 2010 from http://web.archive.org/web/20051125054122/www.sonos.com/products/zoneplayer/.
"Sonos Multi Zone Digital Music System—play digital music from PC in any room," Sonos, Inc., web page, downloaded and printed Aug. 16, 2010 from http://web.archive.org/web/20051024004110/www.sonos.com/US/products/?tref=ghome.
"Niles Intellipad" CI Solo IR & Intellipad "Select IR Keypads Expand Multizone Control in Any Environment," Niles Audio,

(56) References Cited

OTHER PUBLICATIONS press release, May 27, 2003, downloaded and printed Nov. 9, 2010 from http://web.archive.org/web/20060316190037/www.nilesaudio.com/press/intellikp.html.
OpenPeak OEM Solutions, OpenPeak, web page, Mar. 7, 2005, downloaded and printed Nov. 11, 2010 from http://web.archive.org/web/200503071 80152/www.openpeak.com/products.html.
Angell, L. "CES 2005 iPod News and Accessories Roundup," Jan. 8, 2005, iLounge.com, downloaded and printed Nov. 11, 2010 from http://web.archive.org/web/20051122142453/www.ilounge.com/index.php/articles/comments/ces-2005-ipod-news-and-accessories-roundup/.
"Philips RC9800i Touch Screen Remote Control User Manual," Philips, published Sep. 27, 2005, downloaded Dec. 21, 2010 from http://download.p4c.philips.com/files/r/rc9800i_00/rc9800i_00_dfu_eng.pdf.
"Philips RC9800i Quick Start Guide," Philips, published Sep. 27, 2005, downloaded Dec. 21, 2010 from http://download.p4c.philips.com/files/r/rc9800i00/rc9800i00_qsg_eng.pdf.
"Klipsch iFi Speaker System Manual," Klipsch Group, Inc., digital file created and last modified Jun. 9, 2005, downloaded Nov. 12, 2010 from http://www.klipsch.com/images/download/155.aspx.
Frakes, D., "Klipsch iFi Product Review," May 25, 2005, MacWorld, downloaded and printed Nov. 12, 2010 from http://www.macworld.com/reviews/product/405843/review/ifi.html.
"Alpine Mobile Multimedia Station IVA-D310 Manual," Alpine Electronics, digital file created May 11, 2005, last modified Aug. 22, 2009, downloaded Nov. 12, 2010 from http://a248.e.akamai.net/pix.crutchfield.com/manuals/500/500ivad310.pdf.
"Audiovox Ipod Mobile Interface Kit Puts Ipod on the Road," Audiovox press release dated Jan. 5, 2005, downloaded and printed Nov. 12, 2010 from http://audiovox2.info/docs/voxx_corp/other/release_AEC_200501052.html.
"Clarion VRX755D Photos Mar. 6, 2005," Clarion, web page, downloaded and printed Nov. 12, 2010 from http://web.archive.org/web/20050306004136/www.clarion.com/usa/products/multimedia/product_largeImage_1_42675_42675.html.
"Clarion VRX755D Owner's manual &Installation manual," Clarion, digital file created Mar. 7, 2005, last modified Jan. 8, 2008, downloaded Nov. 12, 2010 from http://a248.e.akamai.net/pix.crutchfield.com/Manuals/020/020VRX755.PDF.
"Monster iCruze for iPod, MPC FX ICruz, Installation & User Guide," Monster Cable Products Company, digital file created Feb. 3, 2005, last modified Feb. 17, 2005, downloaded Nov. 12, 2010 from http://web.archive.org/web/20060304093951/www.monstercable.com/iCruze/manuals/iCruze_MPCCXiCRUZ_G5jk.pdf.
King, B. "Bose SoundDock Review,", DigitalTrends.com, Jul. 6, 2005, downloaded and printed Nov. 12, 2010 from http://www.digitaltrends.com/ipod-dock-reviews/bose-sounddock-review/.
"Netgear User's Manual for the MP101 Digital Music Player," NetGear, Inc., digital file created and last modified May 19, 2004, downloaded Nov. 12, 2010 from ftp://downloads.netgear.com/files/mp101_user_manual_1_2_11.pdf.
"Netgear Announces Wireless Digital Media Player Bringing Digital Entertainment to the Living Room," Negear, Inc., press release Dec. 22, 2004, downloaded and printed Nov. 12, 2010 from http://www.netgear.com/about/press-releases/2004/20041222.aspx.
"Netgear User's Manual for the Wireless Digital Media Player MP115," Netgear, Inc., digital file created and last modified date Nov. 17, 2004, downloaded Nov. 12, 2010 from ftp://downloads.netgear.com/files/mp115_user_manual.pdf.
"Product Data Sheet, Netgear MP115," Netgear, Inc, digital file created Jul. 15, 2004, downloaded Nov. 12, 2010 from ftp://downloads.netgear.com/files/mp115_user_manual.pdf.
"Logitech 880 Harmony Remote User Manual," Logitech, digital file created and last modified Jun. 3, 2005, downloaded Nov. 13, 2010 from http://edmullen.net/manuals/Logitech_Harmony_880_universal_remote_UserManual.pdf.
"Slim Devices SqueezeBox2 Owners Guide," Slim Devices, digital file created Mar. 20, 2005, last modified Mar. 21, 2005, downloaded from http://web.archive.org/web/20050830212329/http://www.slimdevices.com/documentation/Squeezebox2-Owners-Guide.pdf.
"Slim Devices SqueezeBox V3 Owners Guide," Slim Devices, digital file created and last modified Oct. 19, 2005, downloaded Nov. 13, 2010 from http://web.archive.org/web/20051027070418/www.slimdevices.com/documentation/Squeezebox-v3-Owners-Guide.pdf.
"JBL OnStage iPod Speaker Dock Product Description," Harmon JBL, webpage, Feb. 26, 2005 downloaded and printed Nov. 15, 2010 from http://web.archive.org/web/20050226164935/www.jbl.com/home/products/product_detail.asp?ProdId=ONSTAGE&CheckProduct=Y.
"JBL OnStage Easy Setup Guide,", Harmon JBL, digital file created Aug. 10, 2004, last modified Sep. 10, 2004, downloaded Nov. 15, 2010 from http://web.archive.org/web/20050308165324/manuals.harman.com/JBL/HOM/Owner's+Manual/on+stage_set-up_guide_8-10_revised+book.pdf.
"Delphi SKYFi2 Installation Guide," Delphi, digital file last created and modified Sep. 22, 2004, downloaded Nov. 30, 2010 from https://delphi.com/shared/pdt/consumer/skyfi2_installation_manual.pdf.
"Philips Pronto TSU60099 User Manual," Philips, digital file created and last modified Apr. 22, 2004, published Aug. 31, 2004, downloaded Nov. 22, 2010 from http://download.p4c.philips.com/files/t/tsu6000099/tsu600099_dfu_aen.pdf which is linked from http://www.p4c.philips.com/cgi-bin/dcbint/cpindex.pl?scy=US&sig=AEN&sct=PRONTO_SU1&cat=REMOTE_CONTROLS_CA1&session=20101122142116_68.65.90.154&grp=SOUND_AND_VISION_GR&ctn=TSU600099&mid=Link_UserManuals&hlt=Link_UserManuals.
"MediaLounge Entertainment Network: D-Link.RTM. DSM-320 Wireless Media Player Manual", DLink, dated Jun. 22, 2005, downloaded Nov. 22, 2010 from ftp://ftp.dlink.com/medialounge/DSM320/Manual/dsm320_manual_150.zip.
"Homepod User Manual," Macsense Connectivity, Inc., digital file created and last mofied Feb. 3, 2004, downloaded Nov. 22, 2010 from http://web.archive.org/web/20051026080703/http://www.macsense.com/product/homepod/docs/HomePod%20USer%20Manual.pdf.
Angell, L., "Speakercraft's Mode controls iPod in multiple rooms,", iLounge.com, Aug. 22, 2005, downloaded and printed Nov. 19, 2010 from http://www.ilounge.com/index php/news/comments/5234/.
"SpeakerCraft Intros Music on Demand Aug. 29, 2005," Synthtopia.com, May 29, 2005, downloaded and printed Nov. 23, 2010 from http://www.synthtopia.com/content/2005/08/29/speakercraft-intros-music-on-demand/.
"Access iPods from Any Room in Your Home Aug. 29, 2005," Synthtopia.com, May 29, 2005, downloaded and printed Nov. 23, 2010 from http://www.synthtopia.com/content/2005/08/29/access-ipods-from-any-room-in-your-home/.
"IPod and MZC Brochure," SpeakerCraft, digital file created Jan. 17, 2005, last modified Apr. 12, 2005, downloaded Nov. 19, 2010 from http://web.archive.org/web/20060311203828/www.speakercraft.com/brochures/pod_mzc_brochure.pdf.
"Escient™ Announces Free Feature Update for Fireball™ Series Music and Media Managers," Escient press release, Sep. 9, 2005, downloaded and printed Nov. 23, 2010 from http://www.escient.com/press/releases/escient_sept09_update.html.
"IPod Integration for Mac: A Guide to Using FireBall with iTunes and iPod for Mac Users," Escient, dated Jul. 18, 2005 downloaded Nov. 23, 2010 from http://web.archive.org/web/20060318220040/www.escient.com/support/supportdocuments/iPodIntegrationMac.pdf.
Sony DHC-MD515_Manual_1997.pdf, (downloaded from http://www.minidisc.org/manuals/sony/sonysite/DHC-MD515.pdf).
Sony_DHCMD313_Manual_1997.pdf, (downloaded from https://docs.sony.com/release/DHCMD313.PDF).
Later International Search Report in corresponding application 09165979.7 dated Feb. 22, 2007.
PCT International Preliminary Report on Patentability, dated Feb. 28, 2008, from corresponding European Patent Application PCT/US2006/032029.

(56) References Cited

OTHER PUBLICATIONS

European Search Report from corresponding European Patent Application No. 09165979.7 dated Jan. 19, 2010.
Office Action dated Oct. 24, 2008, issued in related U.S. Appl. No. 11/260,699, filed Oct. 27, 2005.
Office Action dated Apr. 24, 2009, issued in related U.S. Appl. No. 11/260,699, filed Oct. 27, 2005.
Office Action dated Jan. 20, 2010, issued in related U.S. Appl. No. 11/260,699, filed Oct. 27, 2005.
Notice of Allowance dated Jun. 28, 2010, issued in related U.S. Appl. No. 11/260,699, filed Oct. 27, 2005.
Notice of Allowance dated Oct. 15, 2010, issued in related U.S. Appl. No. 11/260,699, filed Oct. 27, 2005.
Office Action dated Mar. 31, 2011, issued in related continuation-in-part U.S. Appl. No. 11/967,692, filed Dec. 31, 2007.
Notice of Allowance dated Aug. 5, 2011, issued in related continuation-in-part U.S. Appl. No. 11/967,692, filed Dec. 31, 2007.
Office Action dated Sep. 23, 2011, issued in related U.S. Appl. No. 12/891,659, filed Sep. 27, 2010.
Notice of Allowance dated Feb. 22, 2012, issued in related U.S. Appl. No. 12/891,659, filed Sep. 27, 2010.
Notice of Allowance dated May 1, 2012, issued in related U.S. Appl. No. 12/891,659, filed Sep. 27, 2010.
Office Action dated Feb. 16, 2012, issued in related U.S. Appl. No. 12/891,724, filed Sep. 27, 2010.
Office Action dated Aug. 28, 2012, issued in related U.S. Appl. No. 12/891,724, filed Sep. 27, 2010.
Office Action dated Dec. 5, 2012, issued in related U.S. Appl. No. 12/891,724, filed Sep. 27, 2010.
Office Action dated May 9, 2013, issued in related U.S. Appl. No. 12/891,724, filed Sep. 27, 2010.
Notice of Allowance dated Nov. 18, 2013, issued in related U.S. Appl. No. 12/891,724, filed Sep. 27, 2010.
Office Action dated Oct. 26, 2012, issued in related U.S. Appl. No. 12/906,022, filed Oct. 15, 2010.
Office Action dated Nov. 25, 2011, issued in related U.S. Appl. No. 12/906,033, filed Oct. 15, 2010.
Office Action dated Mar. 14, 2012, issued in related U.S. Appl. No. 12/906,033, filed Oct. 15, 2010.
Office Action dated Oct. 17, 2012, issued in related U.S. Appl. No. 12/906,033, filed Oct. 15, 2010.
Office Action dated Jul. 5, 2013, issued in related U.S. Appl. No. 12/906,033, filed Oct. 15, 2010.
Office Action dated Dec. 5, 2013, issued in related U.S. Appl. No. 12/906,033, filed Oct. 15, 2010.
Office Action dated Oct. 17, 2012, issued in related U.S. Appl. No. 12/906,047, filed Oct. 15, 2010.
Office Action dated May 14, 2013, issued in related U.S. Appl. No. 12/906,047, filed Oct. 15, 2010.
Office Action dated Nov. 18, 2013, issued in related U.S. Appl. No. 12/906,047, filed Oct. 15, 2010.
Office Action dated May 5, 2011, issued in related U.S. Appl. No. 12/906,052, filed Oct. 15, 2010.
Office Action dated Dec. 20, 2011, issued in related U.S. Appl. No. 12/906,052, filed Oct. 15, 2010.
Office Action dated Mar. 20, 2012, issued in related U.S. Appl. No. 12/906,052, filed Oct. 15, 2010.
Office Action dated Apr. 25, 2014, issued in related U.S. Appl. No. 12/906,047, filed Oct. 15, 2010.
Petition for Inter Partes Review of U.S. Pat. No. 8,090,309, assigned IPR Control No. IPR2015-01463, filed Jun. 30, 2015.
Petition for Inter Partes Review of U.S. Pat. No. 8,725,063, assigned IPR Control No. IPR2015-01464, filed Jul. 1, 2015.
Petition for Inter Partes Review of U.S. Pat. No. 8,725,063, assigned IPR Control No. IPR2015-01465, filed Jul. 1, 2015.
HomeToys.com, "Boston Acoustics Introduces New Tabletop Family Entertainment Center," page dated Sep. 15, 2004, printed Apr. 2, 2015 from http://www.homctoys.com/news/2004/09/15/bostonacoustics-introduces-ncw-tableton-family-entertainment-ccnter/16922698.
Audioholics, "Boston Acoustics Intros New MicroSystem CD," page dated Feb. 27, 2005, printed and downloaded Apr. 2, 2015 from http://www.audioholics.com/news/boston-acoustics-intros-newmicrosystcm-cd.
Boston Acoustics, "MicroSystem CD Owner's Manual," 2004.
Office Action dated Nov. 5, 2014, issued in related U.S. Appl. No. 14/243,915.
Notice of Allowance dated Jun. 10, 2015, issued in related U.S. Appl. No. 14/243,915.
IPR Proceeding IPR2015-01463, "Petition for Inter-Partes Review", 65 pages, submitted Jun. 30, 2015, file name IPR2015-01463-IPR-of-US-Palent-No- 8090309-Petition-for-lnter-Partes-Review-PAPER-02-06-30-2015.pdf.
IPR Proceeding IPR2015-01463, "Patent Owner's Preliminary Response", 66 pages, submitted Oct. 22, 2015, file name: IPR2015-01463-IPR-of-US-Patent-No-8090309-Patent-Owners-Preliminary-Response-PAPER-8-10-22-2015.pdf.
IPR Proceeding IPR2015-01463, "Decision Denying Institution", 23 pages, submitted Jan. 13, 2016, file name: IPR2015-01463-IPR-of-US-Patent-No-8090309-paper-11-Decision-Denying-Institution-01-13-2016.pdf.
IPR Proceeding IPR2015-01463, "Exhibit 1003: Mercer Declaration", 56 pages, submitted Jun. 30, 2015, file name: IPR2015-01463-IPR-of-US-Patent-No-8090309-Mercer-Declaration-EXHIBIT-1003-06-30-2015.pdf.
IPR Proceeding IPR2015-01463, "Exhibit 2003: Microsoft Computer Dictionary 4th edition", 1999, 4 pages, submitted Oct. 22, 2015, file name: IPR2015-01463-IPR-of-US8090309-Ex-2003-Microsoft-Computer-Dictionary-4th-ed-1999-10-22-2015.pdf.
IPR Proceeding IPR2015-01463, "Exhibit 2002: IBM Dictionary of Computing 10th ed", 1993, 4 pages, submitted Oct. 22, 2015, file name: IPR2015-01463-IPR-of-US-8090309-Ex-2002-IBM-Dictionary-of-Computing-10th-ed-1993-10-22-2015.pdf.
IPR Proceeding IPR2015-01463, "Exhibit 2001", 21 pages, submitted Oct. 22, 2015, file name: IPR2015-01463-IPR-US8090309-Ex-2001-CHS-Exs-1-2-4-to-DI-9-Brief-Support-Motion-for-PI-10-22-2015.pdf.
IPR Proceeding IPR2015-01463, "Exhibit 1002: File History of U.S. Pat. No. 8,090,309", 327 pages, submitted Jun. 30, 2015, file name: IPR2015-01463-IPR-of-US-Patent-No-8090309-FH-US-8090309-EXHIBIT-1002-06-3-0-2015.pdf.
IPR Proceeding IPR2015-01463, "Exhibit 1001: U.S. Pat. No. 8,090,309", 21 pages, submitted Jun. 30, 2015, file name: IPR2015-01463-IPR-of-US-Patent-No-8090309-Exhibit-1001-US8090309-06-30-2015-reduced.pdf, 36 pages.

\* cited by examiner

MUSIC AUDIO CONTROL AND DISTRIBUTION SYSTEM IN A LOCATION

RELATED APPLICATIONS

This application is a continuation of U.S. Patent Application Ser. No. 16/426,123 titled "Media Appliance with Auxiliary Source Module Docking and Fail-safe Alarm Modes", filed May 30, 2019, now pending, which in turn is a continuation of U.S. Patent Application Ser. No. 14/944,789 titled "Media Entertainment System with Fail-Safe Alarm Modes", filed Nov. 18, 2015, now U.S. Pat. No. 10,310,801, issued Jun. 4, 2019, which in turn is a continuation of U.S. patent application Ser. No. 14/243,915, titled "Entertainment System With Sourceless Selection Of Networked And Non-Networked Media Content," filed Apr. 3, 2014, now U.S. Pat. No. 9,225,773, issued Dec. 29, 2015, which in turn is a continuation of U.S. patent application Ser. No. 12/906,047, titled "Entertainment System with Sourceless Selection of Networked and Non-networked Media Content", filed Oct. 15, 2010, now U.S. Pat. No. 8,843,092, issued Sep. 23, 2014, which in turn is a continuation of U.S. patent application Ser. No. 11/260,699, titled "Entertainment System with Bandless Tuning, Remote Control, Alarm and Universal Docking," filed Oct. 27, 2005, now U.S. Pat. No. 7,885,622, issued on Feb. 8, 2011, which in turn claims priority under 35 USC 119(e) to, and is a nonprovisional application of, the following U.S. Provisional Applications: Ser. Nos. 60/623,006 and 60/622,924, both filed on Oct. 27, 2004, and 60/637,669, filed Dec. 20, 2004, all titled "Apparatus For Audio Playback And Methods Of Using Same" and Ser. No. 60/708,673, filed Aug. 16, 2005 and titled "Dual-Mode Wired/Wireless Remote Control And Entertainment Unit Using Same," each of such applications being hereby incorporated by reference in its entirety.

FIELD OF INVENTION

This invention relates to the field of electronic entertainment systems and, in particular, to a system which includes a base (table) audio unit, a dual-mode control unit, a fail-safe alarm and a universal docking mechanism for portable music/media players, network and wireless receivers and other (detachable) devices.

BACKGROUND

Electronic entertainment systems are not, as a category, new. Radios, for example, have delivered audio content for more than 75 years. Phonographs have existed for more than 100 years. They have evolved into numerous other pertinent devices, including removable media tape and CD players (both stationary and portable), satellite broadcast receivers and various kinds of portable fixed-media players such as MP3 players. The latter include, for example, various models of the iPod brand MP3 players from Apple Computer, Inc. of Cupertino, Calif., the Zen and other players from Creative Technology, Ltd. of Singapore, and so forth.

Some manufacturers have provided base units into which certain specific portable MP3 players of a single manufacturer, such as Apple Computer's iPod players, may be docked to play music recorded on the MP3 player via amplifiers and speakers external to the player. In general, such units, however, have a limited range of players they can accept as input. This is somewhat problematic in that when a customer purchases such a product, the customer has little assurance that it will not be made obsolete in relatively short order by the introduction to the market of a new MP3 player or other device. Accordingly, a need exists for an entertainment platform which is not so readily obsolesced. To the extent that attempts have been made to provide a more flexible platform that is useful with multiple and future players, typically a standard plug is provided to plug into any analog audio output jack of the player; and there is only limited external control of the player (e.g., forward, back and play).

Efforts also have been made to marry MP3 players with table clock radios. The result is basically a conventional clock radio that can also play songs from the MP3 player via loudspeakers contained in the clock radio. The table clock radio is a ubiquitous household appliance whose functionality has changed little in many decades. Consequently, virtually all commercial clock radios are subject to numerous limitations which lead to a variety of user frustrations not alleviated by the addition of a portable music player as a music source. For example, a clock radio normally has a single volume control which controls the volume of sound when the radio is turned on normally, as well as when the alarm function turns on the radio. Consequently, if one temporarily turns down the volume control while the radio is playing and, not realizing that situation, activates the alarm, then when the alarm turns on, it turns on a radio whose volume has been muted. Thus, the user may not be awakened by the alarm. Conventional alarm clocks have a variety of other limitations and it has become virtually ingrained in the consuming public to expect them.

Radio tuners, particularly user interfaces of such tuners, have also changed very little in years. Yet new broadcast modes, such as satellite radio, HD radio and the like present challenges for the integration with AM and FM tuning bands. For both home entertainment systems and automobile entertainment systems, new interfaces are needed to simplify tuning.

Thus, in general, improved user interface for home and auto entertainment systems are needed.

SUMMARY OF INVENTION

Various efforts to integrate bits and pieces of the audio landscape into a cohesive and affordable system have been met with problems such as, for example, incompatibility of various devices, proprietary frequencies, inelegant user integration, or even high price. The system presented herein provides for more convenient and easier to use hosting for the large number of existing audio products, adaptability to future products, and a better user experience for the consumer. There is shown a system for in-home or in-office use, and some aspects for automobile use, which can accommodate numerous playback or broadcast sources, and provides extensive and advanced alarm clock functionality along with simplified radio station tuning. Some aspects or features may be useful for portable devices, as well, while others likely will not.

Entertainment systems as presented herein address the above-expressed needs and others that will become apparent below. An integrated collection of components, features and techniques together provide improved delivery of (typically, audio) content and improved, simplified control over the delivery and selection of that content, and related functionality. There are various aspects to the system, and related methods as discussed below.

According to a first aspect, an entertainment system is shown, comprising a base unit having electronics including a transceiver for interacting, at least at times, with a control unit via a communications link that is preferably an RF link, and a control unit for controlling the base unit, the control unit being dockable with the base unit to establish direct electrical connection therebetween and including a transceiver for interacting with the control unit via said RF link when undocked from the base unit. The control unit is thus operable in two modes and presents substantially the same user experience in both modes. The control unit may be considered a separate aspect of the invention or system.

The base unit may contain a radio tuner, preferably with bandless tuning capability (see below), and may be designed to receive into a universal docking arrangement a digitally controllable auxiliary audio source such as a portable MP3 player or a variety of other devices, such as satellite receivers, wireless networking cards, and so forth. In one embodiment, the device includes a network card for integrating the device into a computer network through an Ethernet connection, or through WiFi, or PowerLine networks. The radio tuner and/or auxiliary audio source may supply a stream of information from a broadcaster or other medium, about the broadcaster and/or program content, or otherwise, for example; and the base unit may include processing capability to decode, store, recall, and/or display some or all of that information, or otherwise to process the information (for example, to sort it or analyze it), such as to facilitate content selection. The base unit may further provide alarm clock functionality with numerous features including a "fail-safe' volume control system and fail-safe alarm time setting capability.

The device is adapted to obtain streaming audio broadcasts and other networked or Internet based broadcast sources. An example of a streaming audio service compatible with the device of at least some embodiments of the present invention includes Rhapsody by Real Systems. Rhapsody is a streaming service that permits a user to have a remote personal music library. Likewise, the device can play music and content from personal downloaded music libraries, particularly digital libraries such as Napster and iTunes. In one aspect, the invention provides a device for receiving, storing and playing back content from a personal music library stored on a peripheral device.

The device is a "pull" or "on-demand" system, which permits the user to select the audio content from a location remote from the device. This contrasts with "push" systems such as AirTunes, that require a user to control programming from a central computer for supply to remote players. In other aspects, the device provides for a central unit in wireless communication with one or more remote player units. Thus a user can play music in one or more locations in their house, and can control playback from multiple locations, thereby providing whole house audio, without having to run speaker or control wires through walls and floors.

In one aspect, the invention provides a device for receiving, storing and playing back broadcast content. The device provides for numerous features that improve the user experience, and is compatible with a variety of broadcast signals, including those provided on FM, AM, satellite shortwave bands, high definition (HD) and weather radio bands. The device is also compatible with proprietary broadcast formats requiring a decoder, such as those used in satellite radio. In this embodiment, the device is configured with power and signal routing adaptors for XM, Sirius and other satellite radio decoder and control units. The device includes a receiver, optionally a decoder with a storage medium coupled to the decoder, one or more user inputs and a system controller coupled to the user input, an amplifier and optionally a preamplifier, a display screen, and one or more speakers or audio output devices. In one embodiment, the receiver receives a signal, such as a digitally encoded bit stream over-the-air on a plurality of communication resources, wherein each of the plurality of communication resources contains content and associated index information. The decoder selectively decodes a selected plurality of communication resources and the user input selects the selected plurality of communication resources based on the associated index information and selects a portion of the content contained in selected plurality of communication resources to be retrieved. The storage medium stores the content and associated index information contained in the selected plurality of communication resources and the system controller stores and retrieves content to and from the storage medium based on input received at the user input. In another aspect of the present invention, a method of receiving and storing audio radio signals, comprises the steps of receiving a signal, such as a digitally encoded bit stream over-the-air on a plurality of communication resources, wherein each of the plurality of communication resources contains content and associated index information and selectively decoding a selected plurality of communication resources. The method then enables the selection of the selected plurality of communication resources using a user input and the associated index information and stores the content and associated index information contained in the selected plurality of communication resources in a memory device. In a third aspect of the present invention, a system for transmitting, receiving, storing and playing back digital audio radio signals comprises an encoder, a transmitter, a receiver, a decoder, a user input, a storage medium coupled to the decoder, and a system controller coupled to the user input. The encoder encodes one or more content sources and associated index information in an encoded bit stream and the transmitter transmits over-the-air the content sources. The receiver receives the encoded bit stream over-the-air and the decoder selectively decodes the transmitted signal. The user input selects a portion of the content contained in selected communication resources to be retrieved. The storage medium stores the content and associated index information, and the system controller stores and retrieves content to and from the storage medium based on input received at the user input interface. In preferred embodiments, the device is compatible with all types of modular decoder/player satellite radio components, e.g., those from XM and Sirius.

According to a second aspect, there is provided by the control unit a radio tuning interface which presents to a user a bandless tuning experience even when the radio receiver in the base unit covers multiple bands of the radio spectrum. Such a radio tuning interface for a radio receiver having apparatus for receiving signals broadcast on a first band and signals broadcast on a second band, may provide the user only a single frequency selection knob for selecting broadcast frequencies on both bands by presenting the bands as successive rotationally adjacent positions of the knob. This also enables cross-band "seeking" and "scanning" for a station or content of interest. The interface may include a counter or encoder for tracking rotational position of the knob and a processor for generating signals in response to said rotational position, the signals mapping the position to a band and a frequency within the band, a display connected and arranged to display said band and frequency, and a tuner interface supplying said band and frequency signals to a tuner in the base unit. Optionally, the tuner may include so-called one or more station "preset" buttons, which may be used to store, and quickly recall with a simple button press, a desired station(s). If desired, the preset functionality may be combined with information captured from a signal source, such as a radio station, such as the station's call letters. A "soft" button may be provided (e.g., on a touch screen or other input device) and the button may be labeled with the station's call letters. Or a button label area may be provided on screen (e.g., for hardware buttons) and the call letters or station frequency may be displayed there, even if the area is not touch-responsive. Optionally, a sorting algorithm may be used to sort such information and to re-assign stations to preset buttons; for example, to sort stations by music type, if that data is made available. Systems such as RDS supply a number of types of information and different users may wish to use that information in different ways. Preferably, therefore, a mechanism (e.g., software running on a processor in either the control unit or the base unit) is provided to place the unit into a user-programmable mode wherein the user may, through menu picks and other input conveniences, select which information to use and how to use it. Innumerable arrangements are possible by virtue of including a programmable processor element and memory in the control unit and/or the base unit.

According to yet another aspect, there is provided an adapter assembly substantially as shown and described, for receiving audio signal sources, satellite receivers, wireless LAN interfaces and other devices which have different connectors and form factors.

According to a still further aspect, the system may include alarm clock operation and, indeed, by virtue of the processing capability provided, numerous advanced alarm clock features may be incorporated at virtually no incremental cost. Such alarm clock features are discussed below. Some aspects of such alarm clock operation interrelate to another aspect of the invention, whereby separate audio channels with separate volume controls are provided, typically at the input to the audio amplifier, for each signal source or function, so that, for example, the volume of the radio in the alarm clock mode is independently controlled from the regular playing volume of the radio.

Yet another aspect of the system is the architecture of providing a base unit and a remote unit which communicate wirelessly, preferably by RF (though an optical—e.g., infrared—link is also an alternative), and each having a processor, whereby great flexibility and capability are provided, as outlined above and below.

BRIEF DESCRIPTION OF DRAWINGS

The accompanying drawings are not intended to be drawn to scale. In the drawings, each identical or nearly identical component that is illustrated in various figures is represented by a like numeral. For purposes of clarity, not every component may be labeled in every drawing. In the drawings.

DETAILED DESCRIPTION

Figure 1:
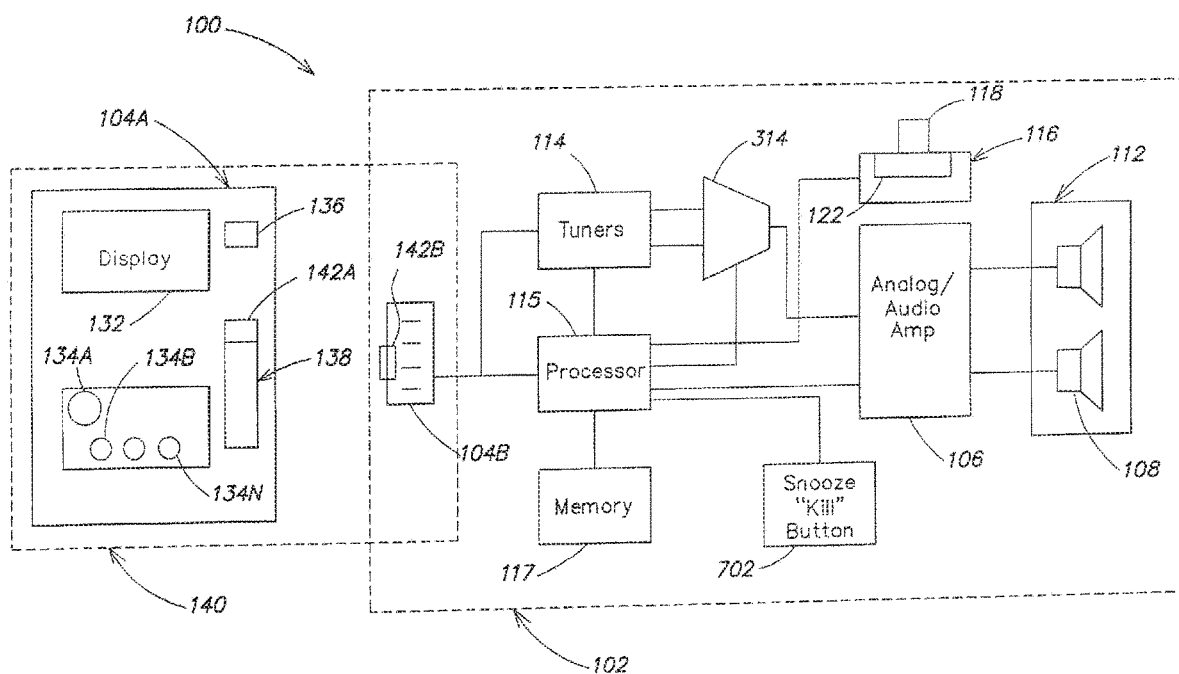
FIG. 1 is a high-level block diagram of an example of a system as taught herein.

This invention is not limited in its application to the details of construction and the arrangement of components set forth in the following description of or illustrated in the drawings. The invention is capable of other embodiments and of being practiced or of being carried out in various ways. Also, the phraseology and terminology used herein is for the purpose of description and should not be regarded as limiting. As used herein, a "processor" can be implemented in any convenient way. It may, for example, be a programmable microprocessor or microcontroller, or it may be an application-specific integrated circuit (ASIC) or it may be hard-wired circuitry, or a neural network, or a gate array or FPGA (field-programmable gate array), or any other form of information processing device. A microprocessor is discussed as a practical example, not to be limiting. The use of "including," "comprising," or "having," "containing," "involving," and variations thereof herein, is meant to encompass the items listed thereafter and equivalents thereof, as well as additional items.

Figure 2A:
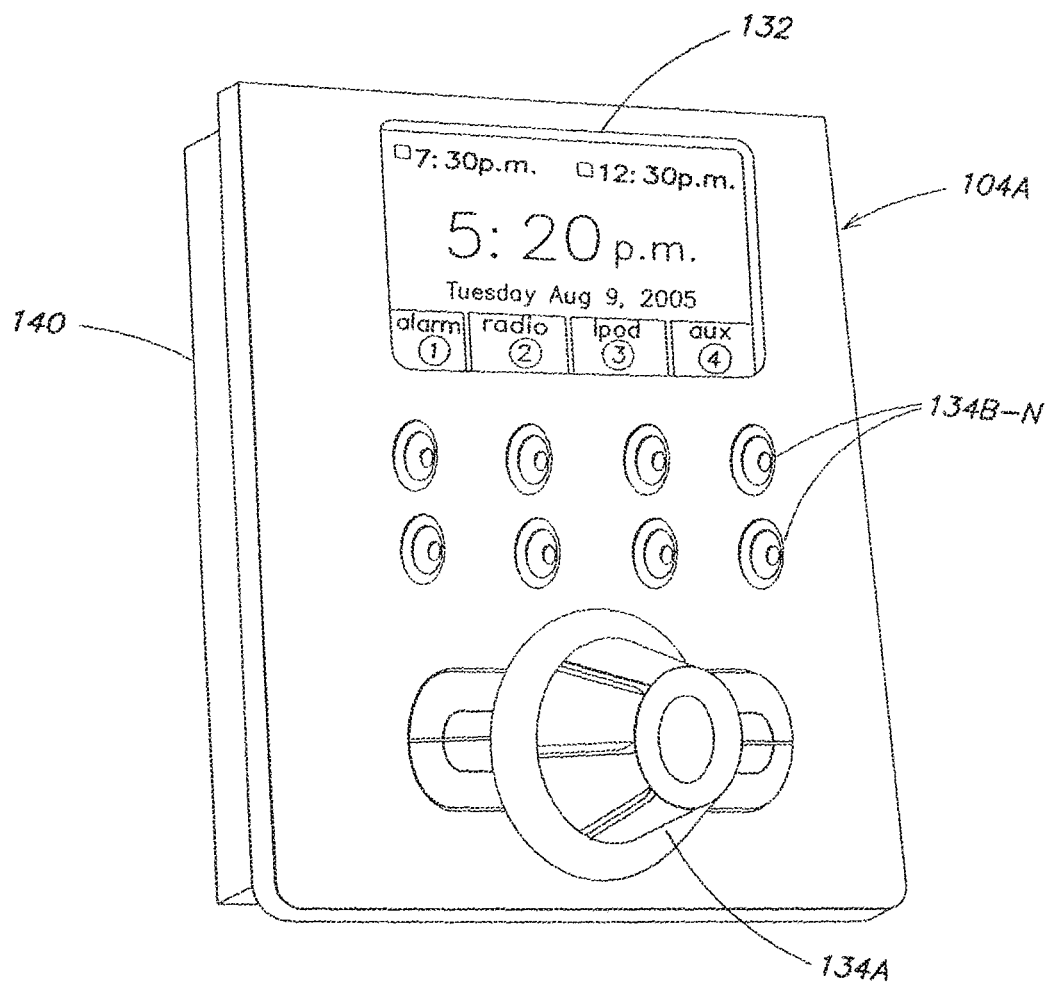
FIG. 2A is a pictorial view of an example of a remote unit for a system as taught herein.
Figure 2B:
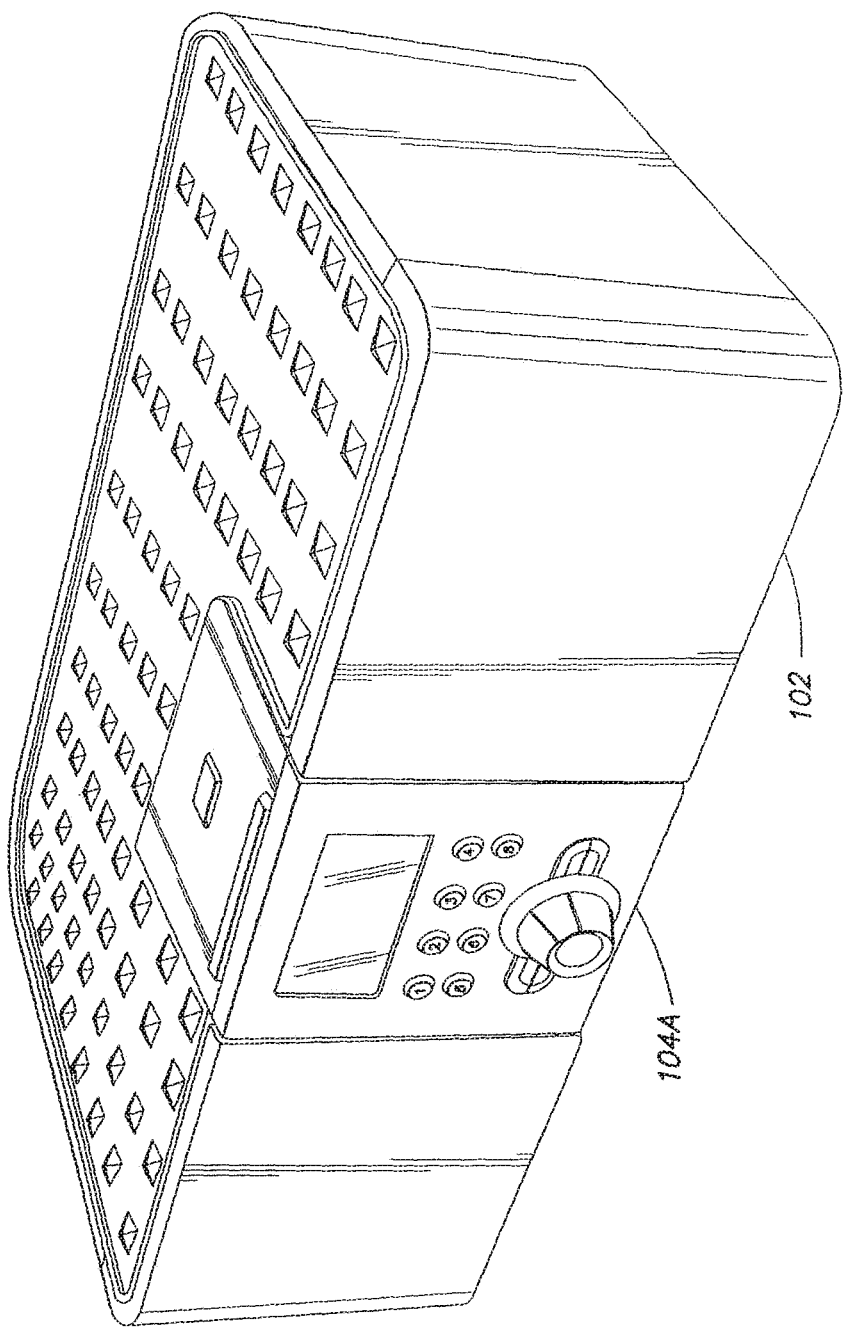
FIG. 2B is a pictorial view of a system as taught herein with the detachable remote unit of FIG. 2A docked with an example of a base unit.

As shown in FIGS. 1 and 2 (i.e., FIGS. 2A and 2B), an entertainment system 100 of the type to be discussed herein has a number of sub-assemblies. These include at least a base or table unit 102 and a control sub-assembly 104. The base unit 102 further includes an audio amplifier 106, one or more (preferably at least two) loudspeakers (or speakers) 108, and housing 112. (As illustrated, the speakers 108 are within housing 112, but this is not required.) It may also include a tuner 114 and/or audio signal source interface sub-assembly 116 connectable to one or more detachable devices 118 (also called Auxiliary Source Modules, or ASMs). The control sub-assembly includes a two-mode, detachable control unit 104A and an interface therefor, 104B, in the base unit. The detachable device 118 is preferably a digitally controlled device that supplies an audio signal (in any acceptable format, analog or digital), via the interface sub-assembly 116, to the audio amplifier 106. For example, the audio signal source in an ASM may be an MP3 player, a device such as an iPod digital player from Apple Computer, Inc. of Cupertino, Calif., a wireless network adapter, a satellite radio receiver, or any other device that can be plugged into interface sub-assembly 116 at connector assembly 122. When the ASM is plugged into the interface sub-assembly, it supplies audio signals to the audio amplifier sub-assembly under control of the control sub-assembly. When the audio signal source (i.e., ASM) supplies an audio signal in a digital format, the audio signal is first routed through a decoder (e.g., in a codec) before the analog decoder output is routed to the audio amplifier. The decoder may be a dedicated module or it may be implemented by software executing on a processor 115 which has multiple functions. The decoder must be appropriate to the signal format, of course, and appropriate decoders will be familiar to software developers and other engineers.

When a network adapter is used (wired or wireless), the system may control a remote device (personal computer, etc.) which can then act as a server of music and other files to the base unit (e.g., from Apple Computer's iTunes service or the like) or as a streaming audio source. With appropriate decoder software executing on processor 115 or another processor (not shown), the device can play songs provided in various music formats, such as WAV, MP3, WMA, and AAC, among others. The system may provide for receiving, storing and playing back broadcast content.

The detachable control unit 104A preferably comprises a display device 132, one or more input devices 134A-134N, a wireless transceiver 136 and a docking (wired) interface port 138, and batteries for power (not shown), in a housing or stand 140 designed to mate with the base unit 102. Preferably, when mated, the control unit 104A and base unit 102 appear to be an integrated device. Optionally, when detached from the base unit, the control unit may be supported on a cradle of convenient design, such as an angled piece of plastic or other material, the arrangement and style of the cradle being a matter of design choice.

The control unit 104A operates in two modes. In a first, docked mode, the control unit is electrically connected to the audio amplifier and signal source electronics sub-assembly via a set of connectors or terminals 142A, 142B and its wireless transceiver is disabled. This "wired" connection conserves battery power (power for the control unit being supplied by the base unit), in a typical implementation it also allows the battery power supply to be recharged from the base unit, simplifies the wireless connection as it is engaged only when the wireless mode is used, and provides the reliability of a direct electrical connection. In a second, undocked mode, the control unit is separated from the base unit and the electrical connection at connectors 142A, 142B is broken. The control unit switches (preferably automatically, with appropriate circuitry detecting the undocking) to battery power and intercommunicating wireless transceivers in the control unit and base unit are enabled.

Preferably, the wireless transceivers provide and receive signals compliant (at least at a physical level) with an industry standard, such as the ZigBee standard. This allows use of inexpensive, mass-produced transceivers. As for the logical levels of the signaling protocol, standardized or proprietary specifications can be employed. One advantage of using a proprietary signaling protocol is that other devices would not be able to control the base unit (e.g., remote controls for other systems, or stray signals of other systems). Optionally, a signaling protocol may be used which allows multiple control units to interact with, and control, the base unit. That way, the user may deploy control units in different rooms in a house or in different places in the same room, for example.

The control unit preferably includes a display, such as a liquid crystal (LCD) screen, for showing the user textual and/or graphical information such as is typically displayed on a home entertainment device. For example, such information may include a selected input device (e.g., built-in radio tuner, iPod portable music device, network card, etc.), volume, song and/or station being listened to (if operating in a radio mode), control functions, etc. Preferably, the display is capable of presenting standard bitmapped graphics to the user, but displays using other formats are certainly acceptable; bitmapped graphics simply provide the maximum display flexibility at the lowest cost. The combination of a processor-operated bitmapped display screen, together with a knob and buttons that can be pressed to move a cursor and indicate a selection, provides for a menu-driven user interface established by software executing on the processor. The details of the interface selections are a matter of design choice. The input source and other user information preferably is displayed on the display screen. Desirably, when the user has selected the tuner as the audio signal source, the system receives and displays RDS (Radio Data Service) broadcast information in a conventional way, which allows a user to receive information relating to the song being played, such as the song title and recording artist. Using conventional techniques, the display screen can be programmed to deliver content in multiple selectable languages. In other embodiments, display content may be replaced by or complemented by voice prompts during user-defined operations. The use of voice prompts permits operation by vision-impaired individuals.

The display outputs data obtained locally in the control unit and/or obtained from the base unit via the interface. In addition, the control unit includes input devices such as one or more switches and one or more knobs. One of the knobs, 134A, preferably is a tuning knob, as a rotatable knob appears to be widely adopted for radio station selection and other inputs of home entertainment devices. A knob, however, certainly is not a requirement. Any suitable input device may be substituted, such as switches for directing upward and downward frequency change.

Tuning

Preferably, the tuner (the details of which are not relevant, as any conventional turner can be adapted for use in this system) is capable of receiving broadcast signals from different radio bands, such as the AM band, the FM band, other radio sources such as satellite broadcast bands (which may be subscription services), or direct audio broadcast or internet broadcast or other such services. Each of those bands occupies a different segment of the radio frequency spectrum or the equivalent, addressable "space." Each radio band typically is allocated to a broadcast service which, by regulation, employs a specific type of modulation scheme for encoding information that is transmitted, for example, in the AM band, amplitude modulation is used; while in the FM band, frequency modulation is used. (Likewise, the other services use distinct modulation or encoding schemes.) In a typical AM/FM radio, the processing of a received AM signal is thus usually performed by circuitry which is almost completely different from that used for processing a received FM signal. The outputs of the AM section and the FM section are, however, supplied to an audio amplifier and speakers shared by those two sections. Typically, a user operates a band selection switch to choose which of the two sections is energized and connected to the audio amplifier, etc. Appropriate mechanics, logic and circuitry may switch the source of some of the screen information to show appropriate frequency and other information, and connect the input controls to control the frequency setting of the selected section and sometimes to adjust functions such as sensitivity or filtering.

At one time, the program content of AM and FM stations were markedly different. FM broadcasts are better suited to the delivery of music and tended more to provide music content. AM broadcasts were largely used for talk shows, news reports, sports and the like, with less music. Programming in the two bands is now far less distinct than it was decades ago and users often make less distinction between the two bands than was true years ago. Talk shows, sporting events, etc. are frequently broadcast on the FM band, for example. Yet users still have to consciously switch between bands on their AM/FM and other multi-band radios.

Figure 3:
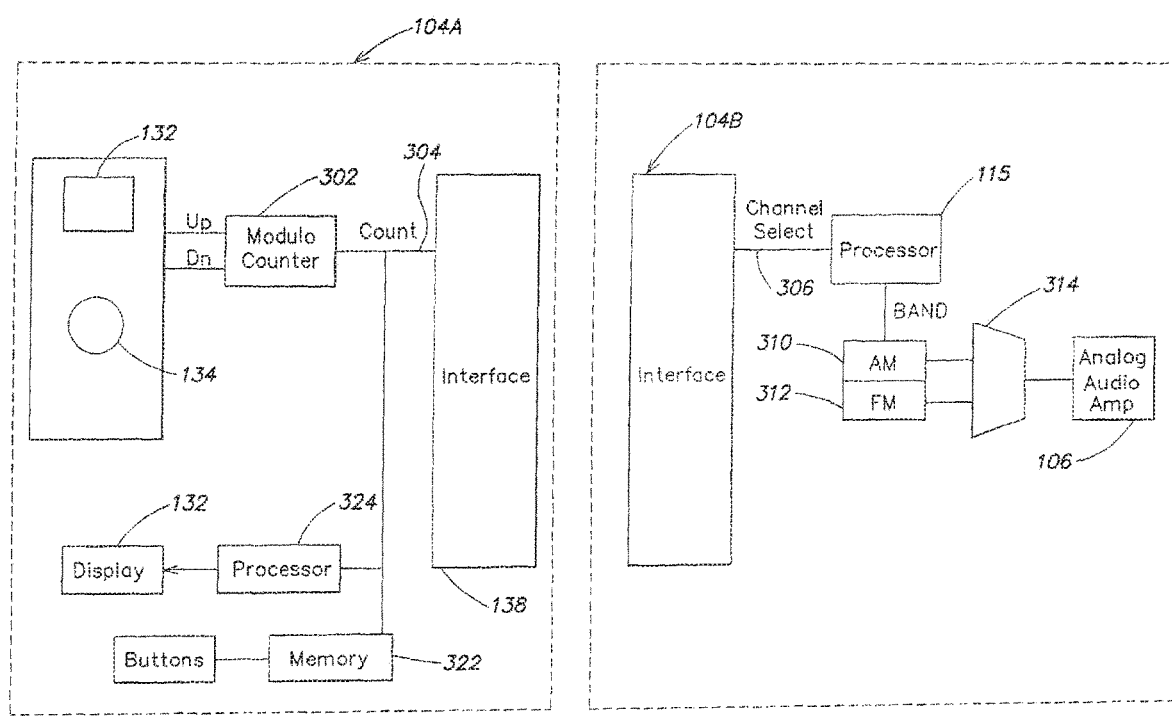
FIG. 3 is another high-level block diagram further illustrating the architecture of the components of the remote unit and base unit in an exemplary embodiment.

Turning to FIG. 3, there is shown in block diagram form an arrangement we call "bandless" tuning, whereby no AM/FM switch is presented to the user and the user does not have to activate a switch to change bands. Instead, one simply tunes from the end of one band directly into the beginning of another band, as though they were contiguous in frequency. The illusion is given the user of single band operation. The bands can be arranged in a loop, so that the top end of the last band in sequence wraps to the bottom end of the first band. If there are three or more bands, they may be arranged in any desired sequence. To effect this operation, various implementations are possible. The implementation shown in FIG. 3 is presented by way of illustration and example only, not to illustrate specific circuitry. There, an all-digital control system is depicted for selecting the active tuning section and connecting it appropriately. A tuning knob 134A provides UP and DOWN (DN) counter control signals (in response to clockwise and counterclockwise rotation, respectively) to associated circular (modulo) counter electronics 302, the design of which is well known to electronics engineers. The counter 302 supplies a digital output signal on line 304. The digital signal on line 304 represents a count value from a counter whose count increments, for example, as the tuning knob is rotated clockwise, and whose count decrements as the tuning knob is rotated counterclockwise. The COUNT signal on line 304 may represent a number from zero through a maximum value determined by the designer to resolve at least a certain predetermined number of radio station channel assignments so that there is a 1:1 mapping of count values and channels (frequencies). Through whichever interface is employed at the time (wired or wireless), a corresponding CHANNEL SELECT signal is conveyed on data line(s) 306 to a processor 115. The processor maps the CHANNEL SELECT signal to the band to which the count corresponds and (a) sends to the tuner a BAND signal or equivalent which switches on the corresponding one of the receiver units 310 (for AM) or 312 (for FM), (b) supplies a FREQUENCY signal to that receiver unit, and (c) selects the output of the selected receiver unit to be connected to the input of the audio amplifier by supplying an appropriate control signal to a multiplexer 314, for example. The output of the multiplexer 314 is connected to the input of audio amplifier 106.

Assume that there are not just two, but three, bands covered by the receiver, for example: the broadcast AM band of approximately 535-1650 kHz, the FM band of approximately 88-108 MHz, and a third band covering weather service channels in the 162.4-162.55 MHz range. Like the FM broadcast band, the weather service broadcasts are transmitted using frequency modulation. There are thus six band limits: the lower and upper limits of each band. Let us call the lower limit of the AM band AML (denoting the value of the CHANNEL SELECT signal corresponding to that lower limit; the upper limit of the AM band, AMU; the lower limit of the FM band, FML; the upper limit of the FM band, FMU; the lower limit of the weather band, WL; and the upper limit of the weather band, WU. Thus if AML≤CHANNEL SELECT≤AMU, then the processor provides a BAND signal that selects the AM receiver and activate AM reception. Similarly, if FML≤CHANNEL SELECT≤FMU, the processor provides a BAND signal that selects the FM receiver and activate FM reception. If WL≤CHANNEL SELECT≤WU, the BAND signal also selects the FM receiver, to effect reception of an FM signal, but the value of the FREQUENCY signal will be appropriate to the weather band instead of the FM band. Clearly, this methodology may be extended to the use of different or additional bands or services that are accessed using a tuning metaphor or mechanism, such as DAB, satellite and HD radio.

Various receiver circuits may require tuning component or parameter changes customizations for different broadcast bands, such as different antennae, different bandpass filters, etc. All of these customizations can be controlled appropriately from the BAND signal(s) or from a combination of those signals and the FREQUENCY signal, as will readily occur to those skilled in the art.

In some embodiments, the tuner may be placed into a "scan" mode whereby, taking advantage of the "bandless" tuning capability, the tuner may cycle through a series of frequencies associated with a first band and then begin automatically to scan through a series of frequencies of a different band. For example, a user may initiate the scan feature when the tuner is initially set to a station "low" in the AM band. The tuner cycles through the AM band, playing short (e.g., three-second) samples of each station it encounters. At the top of the AM band, whereas most radios would begin a second survey of the AM band starting back at the bottom, instead the system begins a scan of the FM band. Scanning may combine other bands or different bands, or be limited to a single band, at the user's selection. This operation is particularly useful in automotive environments, to minimize a driver's distraction incurred when interacting with radio controls.

Figure 14:
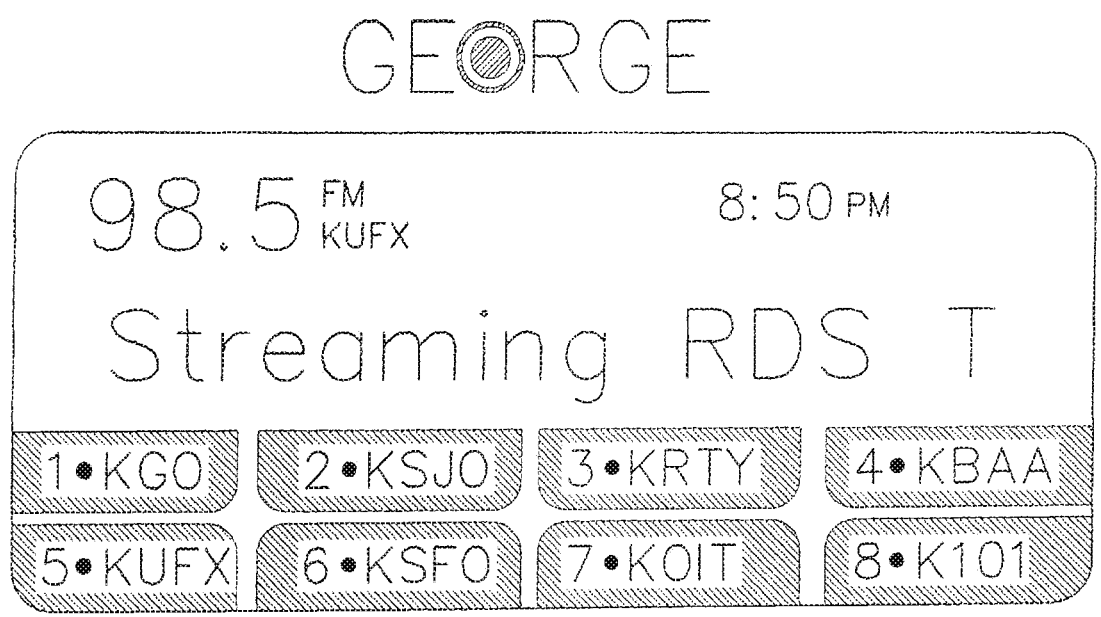
FIGS. 14 and 15 are close-up views of a display on an example of a control unit, illustrating on-screen labeling of soft buttons (shown below the screen on the control unit)
Figure 15:
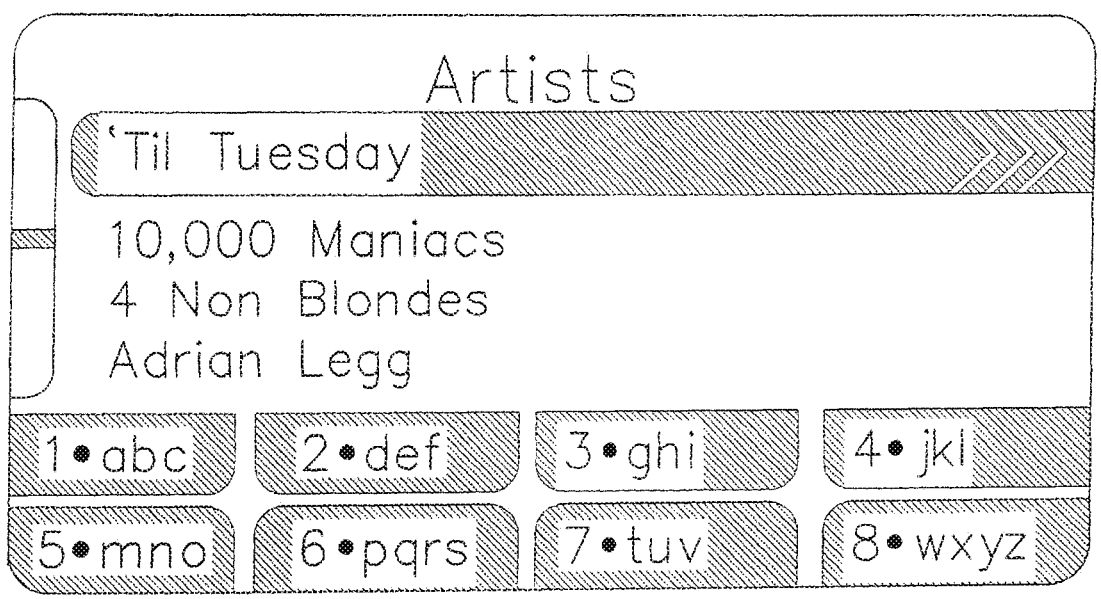

In other embodiments, bandless tuning may be adapted to scan broadcast signals as well as signals input from peripheral devices, allowing the system to scan through content in the FM and satellite bands, and from a music library. All of these variations require no more than minor programming changes that will be obvious to anyone skilled in programming within the architecture of the system. For example, the bandless tuning feature may be coupled through software to the RDS information, also, so that scanning is limited to stations that meet certain user-defined criteria. For example, with the bandless feature turned on, scanning can be set to sample only stations broadcasting in talk radio format on the AM, FM and satellite bands. On a tabletop system or car radio, dedicated or soft (programmable) buttons (which may be self-labeling on the display) may be provided, to be preset to filter stations according to characteristics programmed into the button. A user might set up, for example, a country music button, a sports button, and an "all news" button, or a button dedicated to call a specific song or playlist from an auxiliary source such as an iPod player, using an appropriate codec. Alternatively, some or all of the preset buttons can be mapped to positions of the tuning knob (encoder) and treated the same as radio stations, for simplified, pre-configured access, scanning, etc. With reference to FIGS. 14 and 15, there are shown, respectively, examples of display screens whereon radio stations "presets" have been mapped to eight soft button labels indicating how the soft buttons will operate when pressed (FIG. 14) and whereon an alphabetical keypad arrangement is mapped as an alternative for use in navigating a song index, for example (FIG. 15).

The arrangement shown in FIG. 3 and discussed above is exemplary only. Numerous other configurations will readily occur to those skilled in the art. For example, in the example, the counts (channel selection signals) for AM, FM and weather bands are expressly neither contiguous and continuous nor discontinuous; they may be either. Also, those bands may be divided into sub-bands, if desired.

When one of the "bands" is a digital "radio" service, such as a satellite, internet or direct audio broadcast service, then one merely employs a processor running browser or other software as the "tuner" for accessing that service, or a similar "receiver," and tuning involves the BAND signal being a signal to start the receiver (e.g., start the browser or other software and connect to the Internet) and the FREQUENCY signal supplying a URL or Internet IP address instead of a frequency. Memory can supply to the display any desired identifier for the "station." Each of these non-radio-frequency broadcasts can be mapped to its own band for tuning purposes.

With this "bandless" tuning methodology, the user need not even be concerned with whether a particular station is in one band or another. Further, it has been common practice to provide on some tuners a number of buttons for station "presets;" that is, buttons which can be assigned to preselected stations so that the user has fast access to those stations by merely pressing the assigned button. However, the number of buttons provided is finite, typically in the neighborhood of about six or eight, most often (but not always) with a dedicated number of button positions for each band. Yet one user may wish to listen (in the extreme) only to AM stations and another user may wish to listen (again, in the extreme) only to FM stations. Thus, each user would be able to use only the six or eight (or other number of) buttons provided for his favorite band and the other buttons would be unused. By contrast, as stations herein are mapped to CHANNEL SELECT counts and those counts are "agnostic" as to band until the processor decodes them, a preset button in this system preferably stores a station count in a memory 322 in a "record" mode and then causes that count to appear as the COUNT and CHANNEL SELECT signals when the preset button is pressed, overriding the knob (counter) output. In this way, the buttons can be assigned to stations in any band. If twelve buttons re provided, the user can assign them all to a single band or assign them in any arrangement and number to different bands. The user might, for example, group the button assignments according to the program content type of specific stations, regardless of band. For example, the first two buttons might be assigned to AM and FM stations that have good weather reports. The next three buttons might be assigned to one AM station and two FM stations that play "oldies" music. And so forth. Note that it is unnecessary for the user to use a switch to select a band; thus, there is no AM/FM switch.

In the control unit 104, there preferably is provided a processor 324 which performs various functions, including controlling the information shown on display unit 132. This processor receives the count output by the tuning knob circuitry or "preset" buttons, if any are provided, and converts the count to a frequency assignment (e.g., through use of a lookup table or algorithm, not shown) which is then shown on the display unit. Optionally, other information may also be displayed on the display unit, such as the time and/or data supplied in a signal from the radio station, including the station call letters, type of program content, name of a song being played and the artist and album, or other information.

Preferably, the processor in the control unit and the processor in the base unit are the same type or family of processor, whereby much of the software need be written only once and can be used by both processors.

The control unit may also include circuitry and programming for the processor to provide "alarm clock" functionality, including a clock and interfacing between the clock and the controls of the radio circuits. Such circuitry is conventional and need not be shown in any detail.

Figure 4:
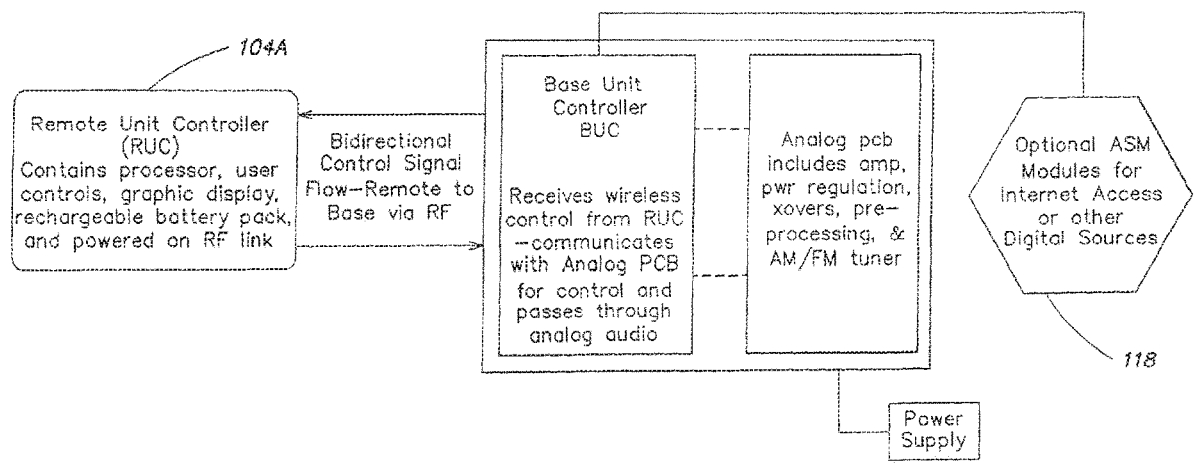
FIG. 4 is a diagrammatic illustration of the signal flow between the remote unit and base unit when the remote unit is undocked.
Figure 5:
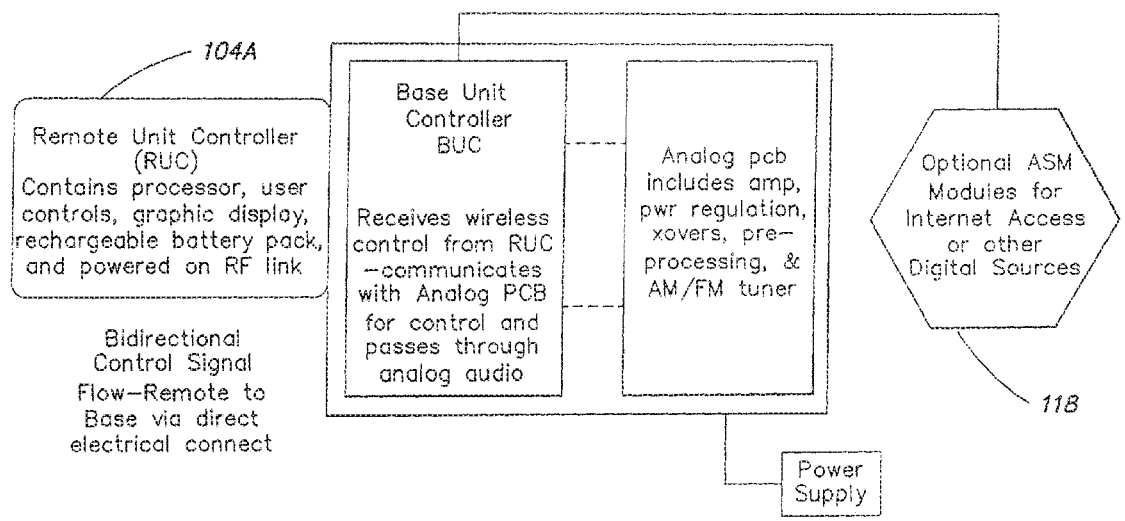
FIG. 5 is a diagrammatic illustration of the signal flow between the remote unit and base unit when the remote unit is docked.
Figure 6:
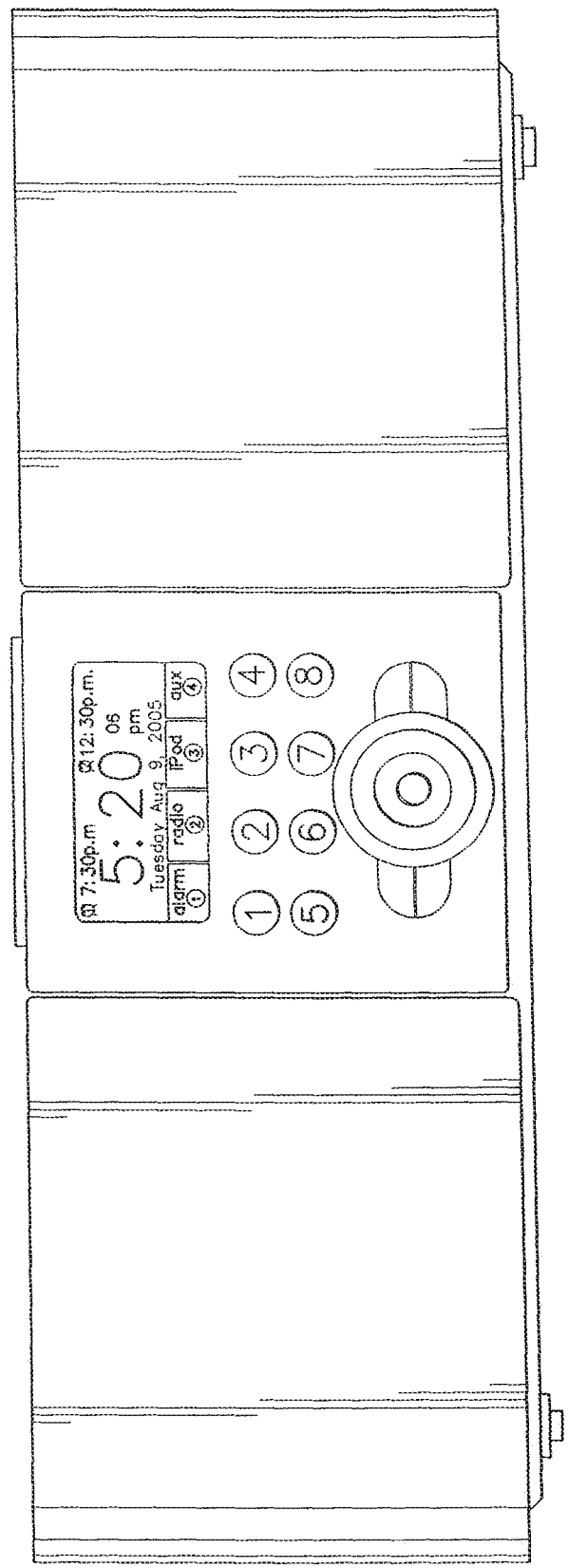
FIG. 6 is a front view of an example of an entertainment unit as taught herein, with a docked remote control unit and a simulated display.
Figure 7:
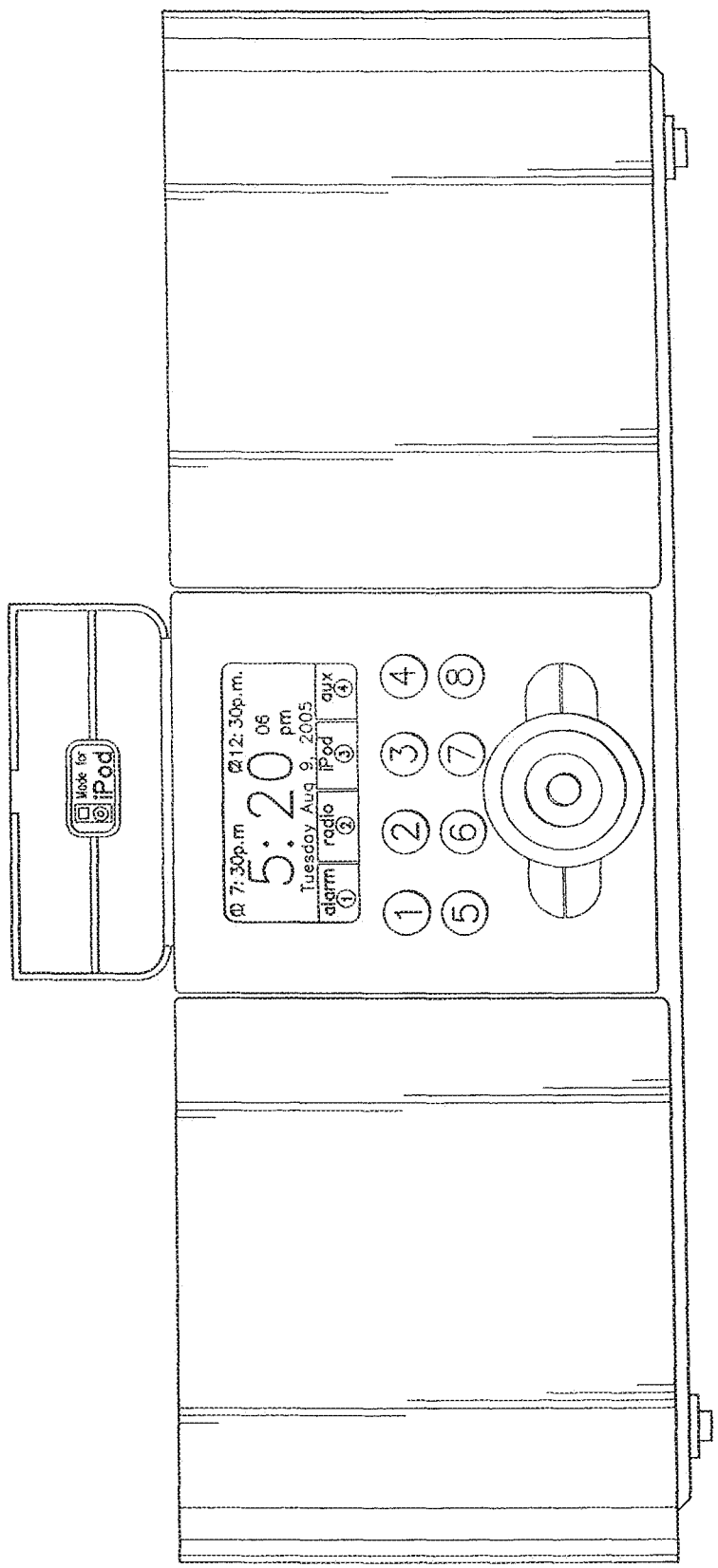
FIG. 7 is another front view of the unit of FIG. 6, showing a top panel open to receive an ASM.
Figure 8:
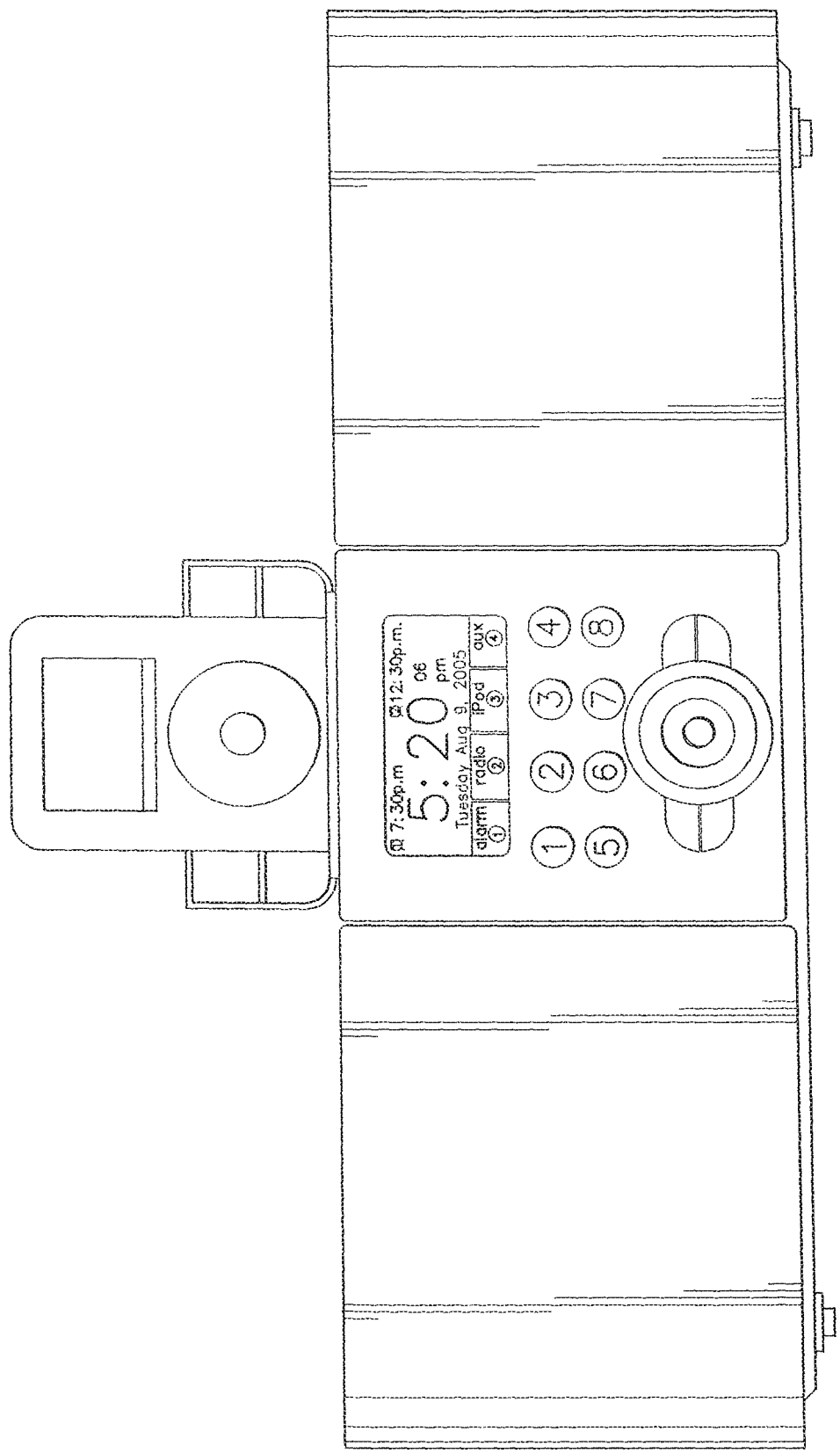
FIG. 8 is still another front view of the unit of FIGS. 6 and 7, with an Auxiliary Source Module (ASM) docked.

Referring now to FIGS. 4 and 5, there are illustrated examples of the signaling operation which may be established between the control unit and the base unit in, respectively, the undocked and docked configurations.

In the undocked configuration, the control unit 104A (labeled "Remote Unit Controller") communicates with the base unit 102 via a wireless channel provided by, for example, a ZigBee-compliant (or partially compliant) transceiver.

Figure 16:
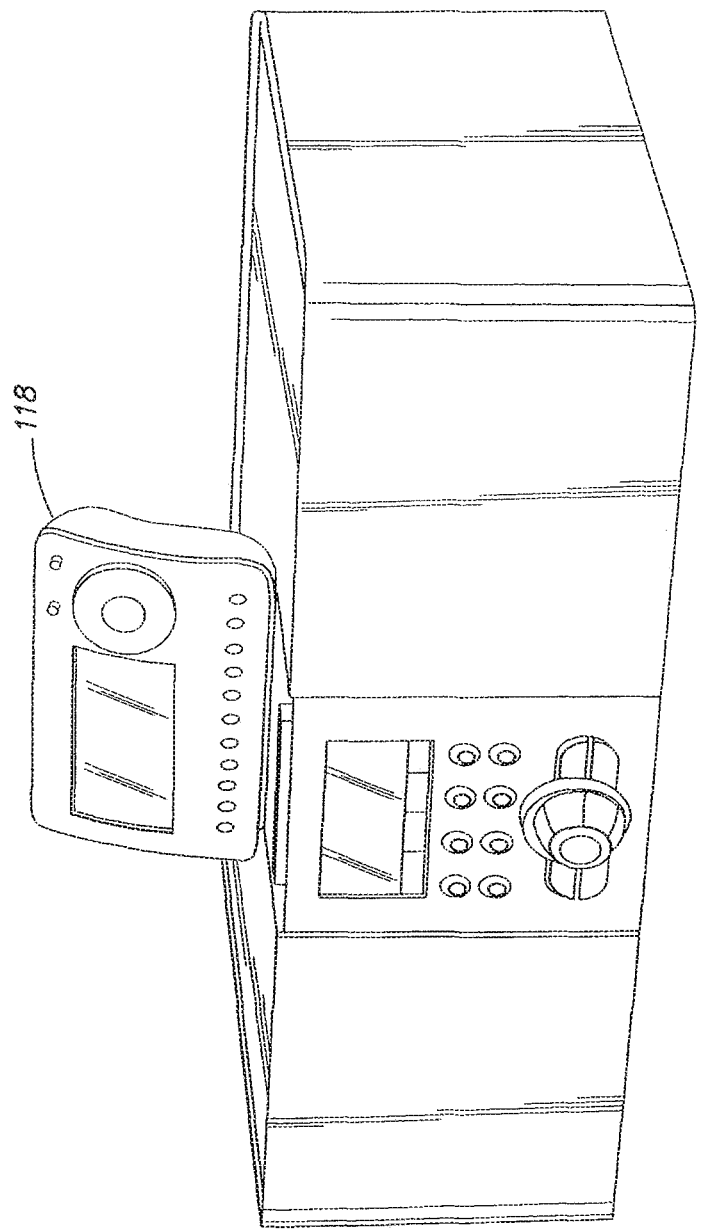
FIG. 16 is an isometric view of an example of a system as discussed herein, with a docked control unit (or permanently attached control unit) and another ASM, perhaps a satellite receiver, docked on top.

In the base unit, the described functionality may be implemented in many ways, the selection of which is based on practical considerations of cost, space, power consumption, and the like. One typical arrangement is shown in FIGS. 4 and 5. There, the base unit comprises a base unit controller (BUC) module 402 and an analog circuit board module 404. Optionally, the base unit may also have, or be able to receive (e.g., at a socket), a device we term an Auxiliary Source Module 118. The Auxiliary Source Module may be any of a number of kinds of devices. For example, it may be a device that provides audio files in mp3 or .wav or other convenient format (e.g., an iPod device from Apple Computer, or other portable music player); a wireless local area network (LAN) card providing connectivity to audio files on a server or to an internet router, permitting the downloading of music and other files; or a receiver for a service such as satellite radio, as depicted, for example, in FIG. 16. The output from the Auxiliary Source Module is routed to the BUC module instead of to the analog circuit board, preferably, in order to employ the processor in the BUC module to decode any digital audio signals and convert them to analog form before being provided to the analog module. If the signal is already in analog form, of course, if can be passively routed to the analog module by the BUC module.

The BUC module includes a wireless transceiver for communicating with the control unit, a processor 115, and an interface 406 to the analog circuit board module for control and to pass through analog audio signals. The analog circuit board typically includes audio amplifiers, power regulation circuits, and pre-processing apparatus. The audio output from the analog circuit board is connected or connectable to speakers 108 located inside or outside the housing for the base unit. The AM and FM tuner circuits are preferably provided on the analog circuit board, but they could be provided on a separate board.

The audio output from the Auxiliary Source Module, if one is provided, may be routed directed to the analog circuit board or via the BUC to the analog circuit board.

In the docked configuration, shown in FIG. 5, preferably the ZigBee transceivers are deactivated when the direct, physical mating is detected, and a wired connection is established between the control unit and the base unit, as well as a power connection to charge the battery(ies) in the control unit. Otherwise, the system functions the same as in the undocked arrangement.

Universal Docking System

Figure 9:
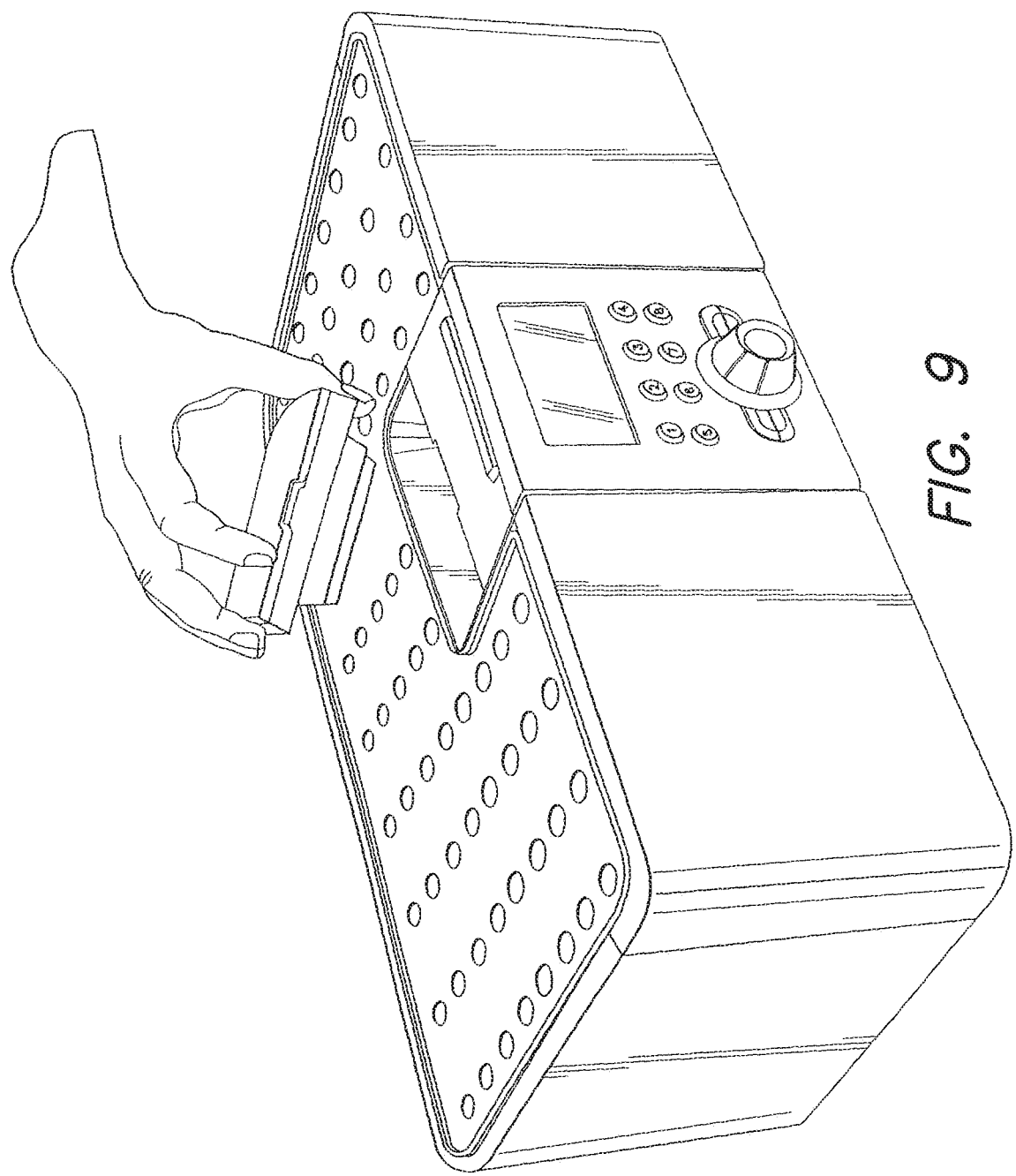
FIG. 9 is an isometric top view of the unit of FIGS. 6-8, showing an example of an interface module for an ASM.
Figure 10:
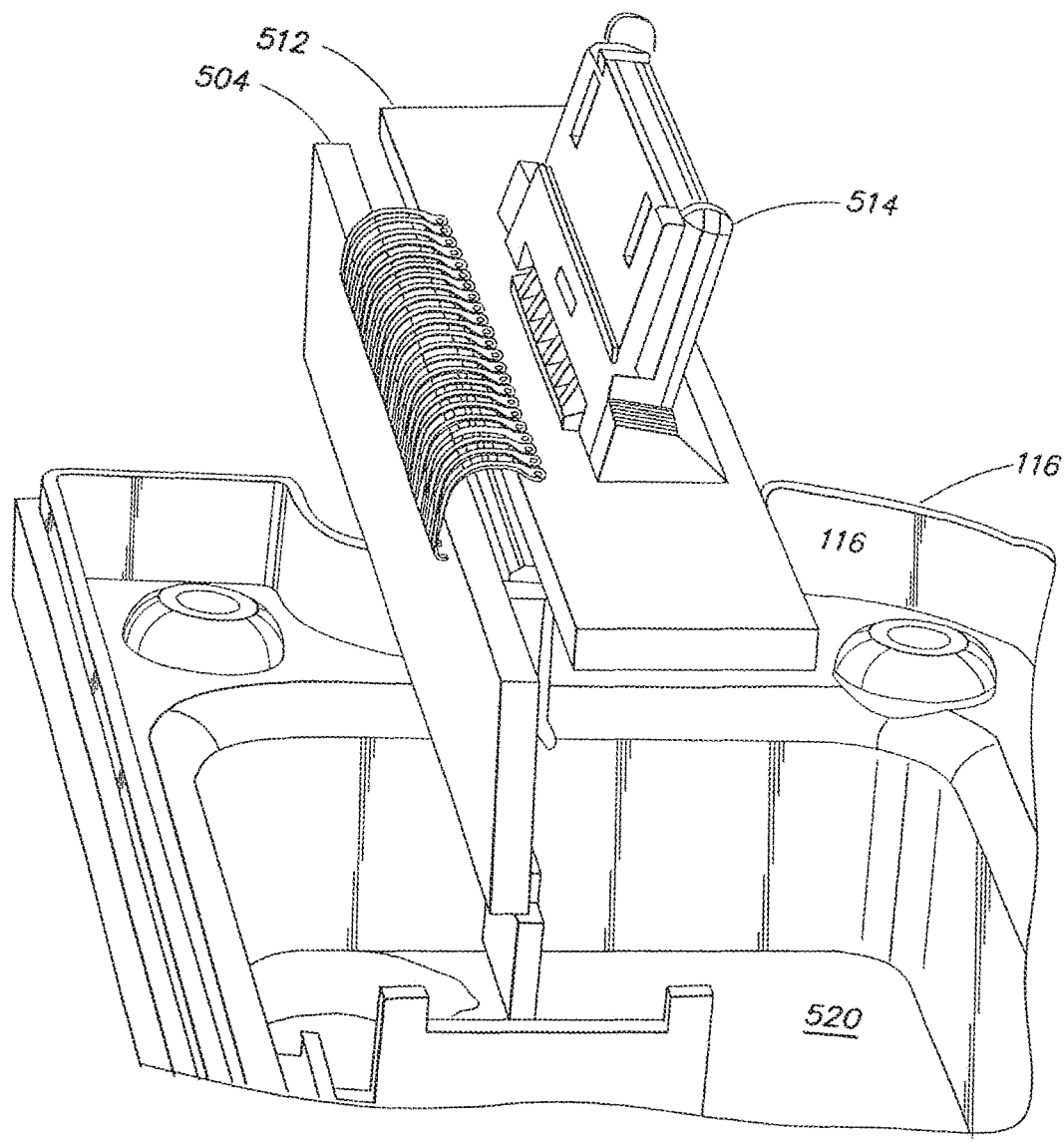
FIG. 10 is a diagrammatic, exploded view of a portion of the interface module of FIG. 9.
Figure 11:
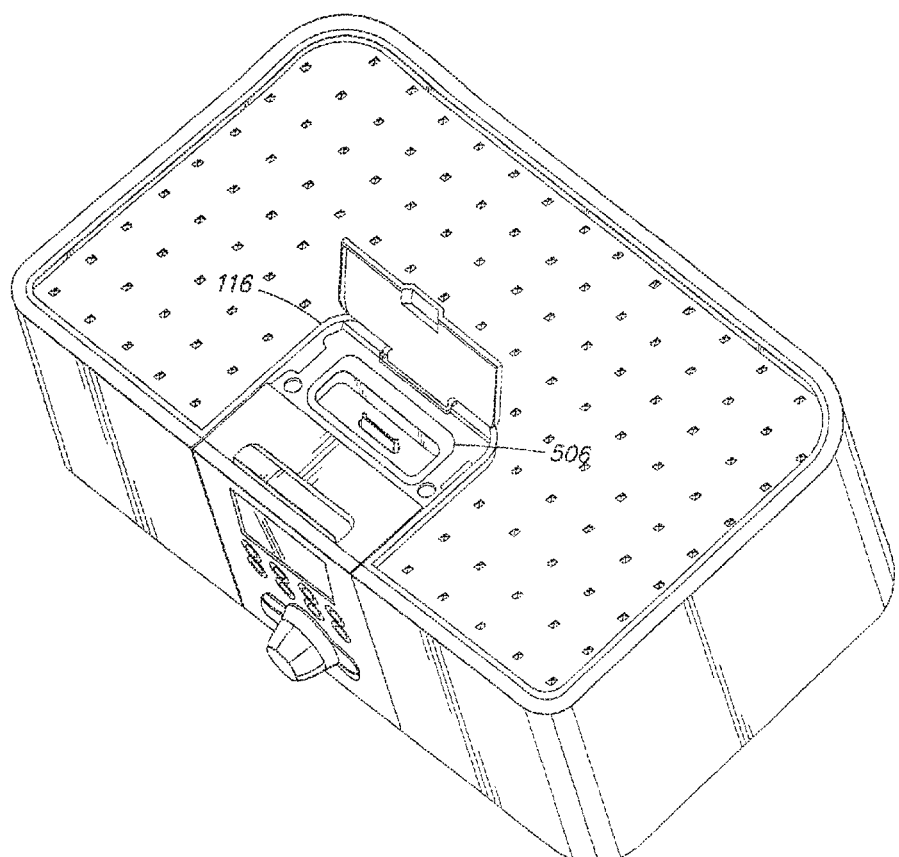
FIG. 11 is a top view of the example entertainment unit showing an interface module in place with the cover open and no ASM docked.

It is desirable, though not required, that the Auxiliary Source Module be connectable to the base unit through a connector. However, it is also true those different signal sources typically will have different form factors and use different connectors. For example, even some of the different models of Apple iPod music players provide different connectors and/or form factors; and Apple iPod devices use different connectors than do Creative Technology's Zen players and XM or Sirius satellite radio receivers. While a system can be made to accept only Auxiliary Source Modules (ASMs) with a certain type of connector and a certain form factor, if the user changes ASM or has multiple ASMs with different connectors and/or form factors, the user would find that the base unit cannot accept all of them or future products of different design. Accordingly, it would be commercially more effective and desirable to permit a user to employ ASMs with a variety of connectors and form factors, interchangeably. For this purpose, a base unit may desirably employ an interface module 116 such as is shown in FIGS. 9-11. The interface module mates to a "universal" connector (not shown) provided as part of the entertainment unit, typically on a circuit board or cable. (The connector is "universal" in the sense that, if it is provided with a sufficient number of connection terminals, or pins, then with the appropriate interface module, a wide range of ASMs can be connected to the base unit.) A typical interface module contains two adapters, a first (electrical) adapter 504 and a second (mechanical) adapter 506. The mechanical adapter may not be required, if the electrical adapter is not "sunken" below the housing surface, as it serves to provide adjustment to the "form factor" of an ASM and to protect a docked ASM and the connectors (on the ASM and in the interface module) from mechanical damage.

The universal connector contains connection pins for power and for the kinds of signals that might potentially (foreseeably) be provided to or received from an ASM. Some ASMs will require fewer connections than others. The electrical adapter 504, in its most basic form, assuming a passive electrical interface suffices, has three components: a first connector (not shown) which is mateable with the "universal" connector (within the entertainment system base unit); an interconnection sub-assembly (e.g., printed circuit board or cable or a combination) 512; and a second connector 514 for receiving an ASM of a particular type. That is, second connector 514 is specific to and compatible with the ASM. In one embodiment, the two connectors may be mounted on different sides of a printed circuit board and the appropriate pins of the first connector may be wired to corresponding pins of the second connector through the printed circuit board, the correspondence being dictated by the functions assigned to the various pins by the ASM manufacturer and the base unit manufacturer. In some situations, not all pins have counterparts. If needed or desired, buffer circuitry can be provided on the printed circuit board, powered from the first connector, to buffer, isolate, amplify or level-shift signals passed between the base unit and the ASM. In another embodiment, which is useful for the configuration illustrated in the drawings, it has been found useful for the interconnection sub-assembly to be formed of a first printed circuit board wired to the first connector, a second printed circuit board on which the second connector is mounted, and a flexible cable interconnecting the circuit boards. Another approach would be to mount the second connector on something other than a printed circuit board, such as a plastic part of the adapter housing, and to interconnect the first and second connectors with a cable, the cable directly connected to the first connector. Still another alternative is to provide two (or more) ASM adapters and switching circuits for selecting one to be active while the other(s) is (are) inactive; or, alternatively switching or arranging one to be an audio source while the other ASM provides other functionality such as networking.

Other configurations may be devised according to design considerations.

Optionally, selected pins of the universal connector can be used to code the identity of the interface module and/or ASM which will be docked. On circuit board 512, the leads from those pins can be tied to "high" or "low" logic levels, so as to identify to the processor in the entertainment unit, via the universal connector in the base unit, a type of ASM. The processor can then retrieve from memory specifications for the ASM and route appropriate signals to and from the pins of the universal connector. Thus, at least some pins of the universal connector preferably are connected to multiplexing circuitry to permit re-routing connections. As new ASM devices are marketed, new specifications can be downloaded to the entertainment unit via a USB port or other interface (not shown).

The mechanical adapter, if used, is intended to provide an appropriate fit between the base unit housing and the ASM, with differently sized mechanical adapters being made available for ASMs of different dimensions or shapes. The base unit is made with an aperture 520 of size sufficient to receive ASMs of maximum expected size. The mechanical adapter 506 has a central aperture sized and shaped and positioned to receive the ASM and to place a connector on the bottom of the ASM into alignment with the second connector of the electrical adapter. The mechanical adapter may, and preferably does, retain the ASM in a slightly recessed disposition, to provide some physical security for the ASM. The mechanical adapter 506 may be provided with a hinged or sliding lid, optionally, to close the aperture 520 and protect connector 514 when no ASM is installed.

Database Management and User Interface

Apple's iPod and similar players now are sold with sufficient memory capacity to store thousands of songs. While this is a boon to music lovers, it also presents a challenge: finding a desired song among the many that have been stored. Creative Technology of Singapore has recognized this problem in its U.S. Pat. No. 6,928,433, which provides a hierarchical interface to facilitate song retrieval. Additionally, facilities are known for creating stored lists of songs, called "playlists." A command to play a playlist causes the corresponding list of songs to be played seriatim. Use of playlists is particularly helpful when an MP3 player is used in an automobile, to relieve the driver of the distraction of having to deal with the user interface to choose a song every few minutes.

On the player, songs typically are stored sequentially as they have been recorded. Means are provided on the player to allow a user to scroll linearly forward and backward through the list of songs, and sometimes facilities are provided to select and play recorded playlists.

Beyond the availability of these features, little facility is available for making it easy for a user to identify and play songs. Currently, iPod devices provide the services of a database engine to external devices because very little database functionality has been built in. Songs, artists and albums and the like are represented by data records. An external device can select which records are to be made currently active, such as all songs, all songs by artist X or all songs from album Y. When an external device accesses a record, however, the record is identified by its position in the list of currently selected records, not by absolute identifier. Thus, a single song will have a different identifier based upon how the user navigated to a current list (e.g., by album, artist, genre, etc.). This is a limiting approach.

To provide improved functionality, when an iPod music player or similar device is docked to the universal connector of the new entertainment connector, all of the records defining the music content on the device are downloaded and a new database is created of that information. This database is created by first writing a list of all artists, then for each artist writing the list of all of that artist's albums, and for each album, retrieving and writing the list of all songs thereon. This creates a database wherein each song is uniquely identified and indexable by the combination of the artist/album/song names. For example, a data tree may be constructed with the list of artists at the top root level, the albums for each artist at the next level and the songs for each album at the third level.

Optionally, secondary indices may be written to permit quick access to, for example, the list of all albums (regardless of artist), all songs (regardless of album or artist), and songs by artist (regardless of album).

Once this database exists in memory (e.g., memory 117) within the base unit, it can be used to implement a variety of access features, including a "jump by spelling" feature, or to easily go from a song that is playing to the list of other songs in the same album or by the same artist or by the same name but by different artists. These access options are all straight forward database programming tasks. Then, once a song is selected to be played by any of these access features, the music player can be controlled via the user interface to serve up the selected song (e.g., by number) and play it back through the base unit. Of course, it is also possible, technically, copyright law permitting, to download the song file into memory (semiconductor, hard drive or optical, for example) in the base unit and to play it from there, using an appropriate codec to turn the stored digital representation into an analog signal that can be supplied to transducers such as loudspeakers.

As shown, the interface module may also include a cover to protect the connector 514 when no ASM is docked.

Alarm Clock

Figure 12:
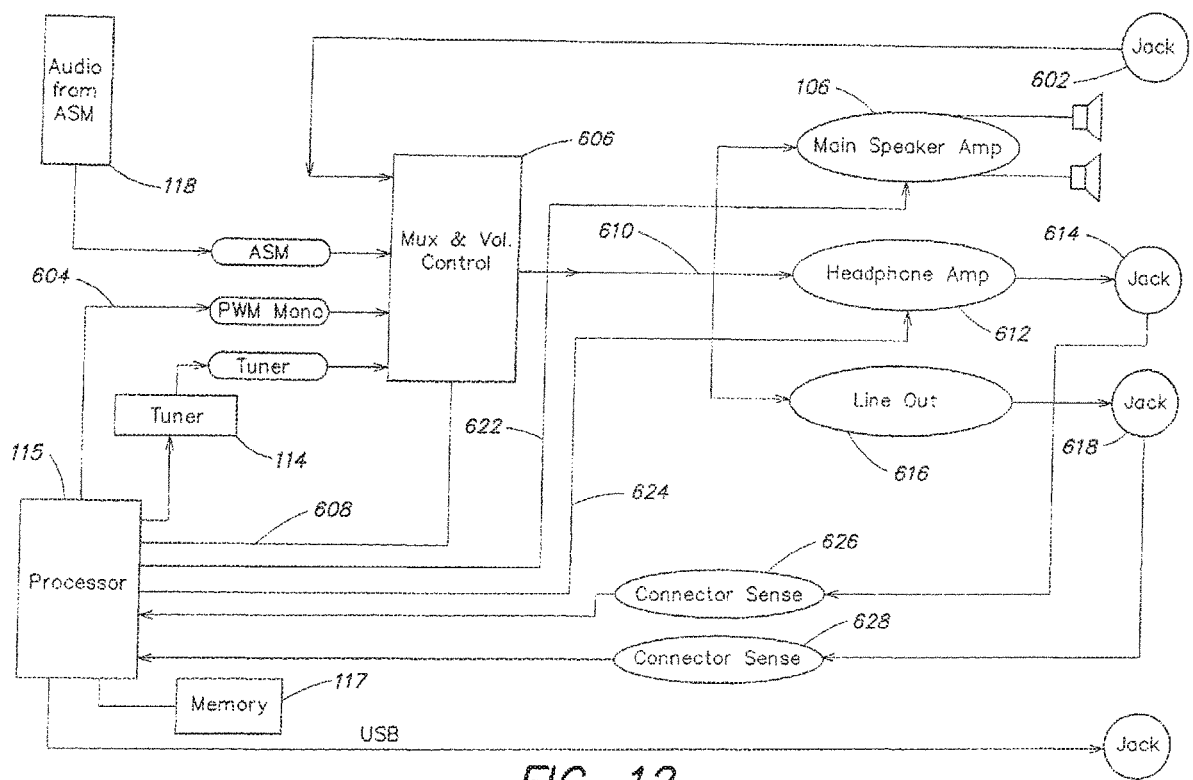
FIG. 12 is a block diagram of audio routing in the base unit to effect some optional "fail-safe" alarm features.

With reference to FIGS. 1 and 12 (discussed below) and appropriate software control to effect the functionality to be discussed, a "fail-safe" radio/player-alarm function is provided which will confirm alarm settings, minimize the risk of a user inadvertently overwriting desired alarm settings and provide a wake-up service in four situations where conventional clock radios will not play a radio or music source to provide a wake-up service. The first situation is that the volume control has been turned down or the volume has been muted by the user, instead of turning the radio off. When the time arrives for the alarm clock to turn on the radio, it does so but the radio emits no or very low sound output. The second situation is when if headphones are left plugged in. Normally, when headphones are plugged in, the speakers are disconnected. Thus, if one goes to sleep with headphones plugged in, the clock radio fails to sound an alarm that will wake the user. Third, if a plug is present on an auxiliary output jack, the situation is basically the same as when headphones are plugged in. Fourth, if the AM/PM setting was incorrect, when the time arrives for the expected alarm (e.g., 6:00 a.m.), nothing happens because the clock radio actually was set to 6:00 p.m.

The enhanced functionality which overcomes these shortcomings is provided by employing a processor in the base unit 102, which may be processor 115 or another processor or microcontroller, to control the volume of the audio channels separately for the alarm function and for the non-alarm "regular play" function. This permits the radio's alarm volume to be controlled independently of normal listening volume and also permits the audio output to be supplied through the system's loudspeakers for alarm purposes even when the speakers are deactivated for other purposes. Additionally, separate volume controls are provided to control the volume emitted by the speakers in alarm mode as compared with normal listening mode. The alarm volume defaults to a pre-set level that should be appropriate for normal alarm usage and steps are taken to require extra efforts by the user to change the alarm volume so that inadvertent changes are made unlikely. For example, the alarm mode volume setting should not be an external knob or slider or similar mechanical control that is too easily turned down to a low setting. It may, for example, be an internal knob or a "soft" setting established on-screen by the user, stored and left to be forgotten. Preferably, if a manual control is employed, the alarm volume control is in a hidden or interior location so that, once set, a user normally will not change the volume setting and thereby defeat the intended "fail-safe" functionality.

When the base unit is connected via a network to a computer, it is straightforward to allow alarm settings to be programmed from the computer, and to store preferences in user profiles in either the computer or base unit or both. Storing default user profiles in the base unit is also one way to facilitate selection of the language of text displayed on the bitmapped graphics of the display device.

Turning to FIG. 12, there is shown a simplified block diagram of audio signal routing and control which provides the basis for implementing, among other things, some of the "fail-safe" alarm features discussed above. As illustrated, four different inputs are presented, which may possibly generate audio outputs. First is an auxiliary input jack 602. Second is an auxiliary source module (ASM) 118. Third is the processor 115, which can generate an alarm buzz by providing an appropriate pulse-width modulated (PWM) signal on line 604. Fourth is the tuner 114. The signals from each of these inputs are supplied to block 606 which is a multiplexer and volume control stage. In exemplary form, the multiplexer (i.e., input selector) and volume control stage 606 may be implemented using a commercially available integrated circuit such as the TDA7462 dual audio processor with compander from STMicroelectronics, Philips's TEF6892H integrated signal processor or other suitable circuit. Mux (multiplexer) and volume control stage 606 is controlled by signals supplied by processor 115 on line(s) 608. The processor determines which of the inputs to the Mux 606 will supply an output signal on line 610 and it also sets the volume (amplitude) of the output signal on line 610. The signal on line 610 may be a monaural or stereo signal, depending on the input, and illustrating output 610 as a single line is not intended to suggest only a monaural signal. Line 610 supplies input to the main speaker amplifier 106, a headphone amplifier 612 to headphone jack 614, and "line out" amplifier 616 to line out jack 618. The main speaker amplifier 106 and the headphone amplifier are each controlled by an on/off signal supplied, respectively, on lines 622 and 624 from processor 115. Finally, circuitry 626 and 628 is provided to monitor the condition of each of headphone and line out jacks 614 and 618, respectively. The output of each of circuits 626 and 628 is provided to the processor 115. Depending upon the state of the output signals from circuits 626 and 628, the processor "knows" whether a headphone is plugged into the headphone jack and whether an external amplifier or other device is plugged into the line out jack, for supplying an audio signal to an external speaker or other lode [load]. When a headphone is plugged into headphone jack 614, the processor detects that condition and turns off the main speaker amplifier for generating an appropriate "off" signal on line 622. The processor may also turn off the headphone amplifier if there is no headphone plugged into the headphone jack, or under other appropriate conditions. Suitable program code executing on the processor implements the alarm clock functions. For each of the input "channels" to Mux volume control 606, a distinct volume control setting (or settings) is stored. The volume control settings may be stored in any convenient location, including in data storage (memory) 117 which is accessible by processor 115. Through the control unit, the user can select one of the inputs and set its volume which is then saved. So the volume for the tuner when it is providing a normal alarm output, is saved separately from the volume setting for the tuner when it is being used as a source of a wake up program. The programming of processor 115 assures that when an alarm "goes off," the control signal on line 622 turns on the main speaker amplifier irrespective of the sense conditions of the headphone jack 614 and line out jack 618, and that the alarm volume is controlled by the pre-saved alarm volume setting, irrespective of the volume settings for any of the inputs in "normal" play mode.

Other fail-safe alarm functions are provided principally by the programming of processor 115. For example, alarm clock users, with some frequency, have been known to mistakenly set an alarm that is in error by twelve hours, because they make a mistake about AM/PM selection, which is often shown simply by a lighted dot. To avoid this problem, processor 115 compares the current time with the set alarm time if the alarm is being set more than 12 hours ahead of the time, an error message is generated to the user, asking whether the indicated alarm time is correct.

Another example of a fail-safe alarm system feature relates to the "snooze" feature found on those clock radios. In the invented system, a user-defined limit is programmed into the processor, and the snooze feature is disabled when the limit is reached, thus providing additional control over such features as the number of times a snooze feature may be activated (to temporarily disable the alarm) or the number of permitted minutes in a snooze cycle. Further, the system may include a feature that the last time the alarm comes on after the snooze cycle has completed, the only way to turn off the alarm is to press a different button on the base unit itself.

Figure 13:
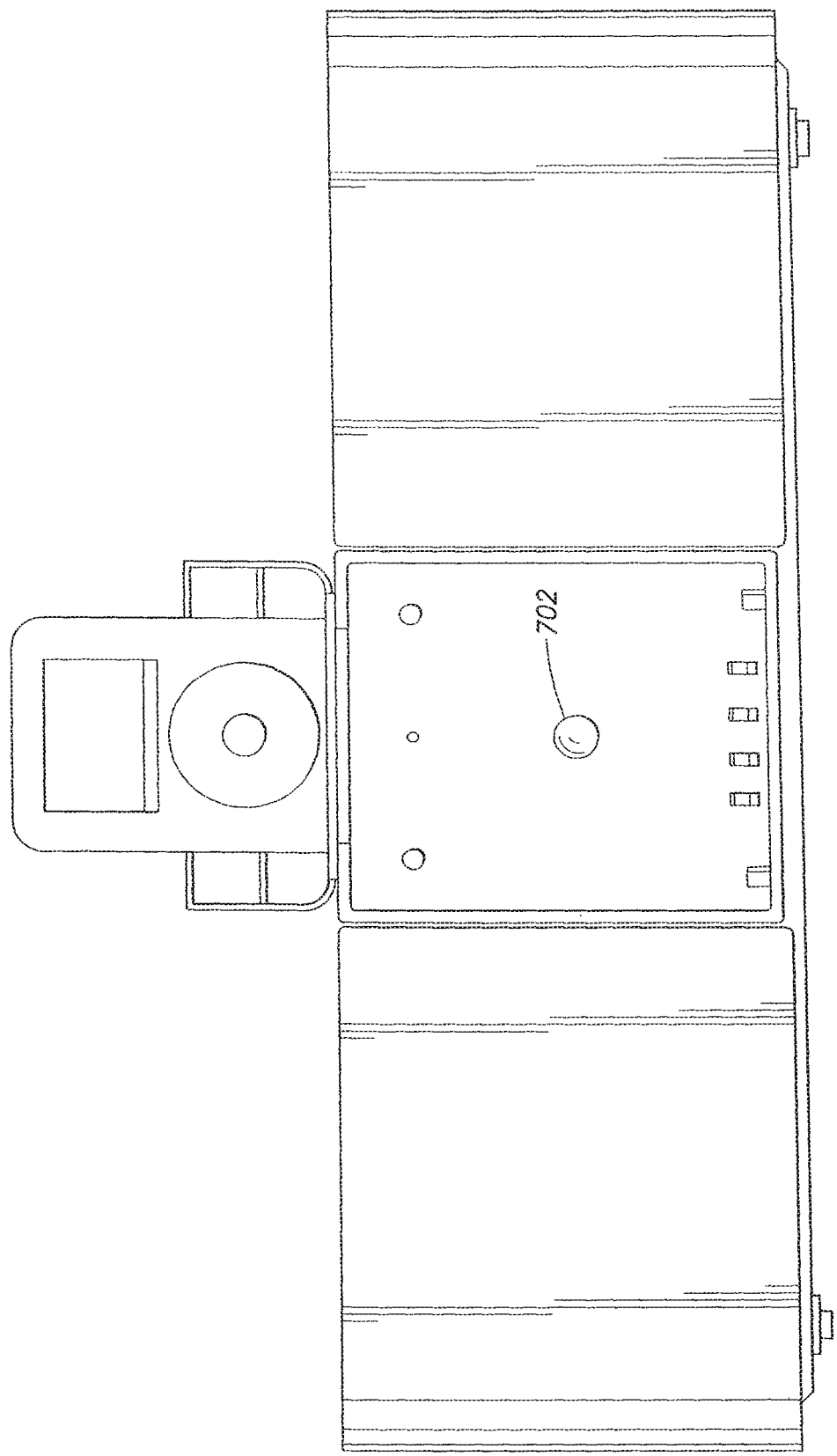
FIG. 13 is a front view of a base unit of an example system, with an Apple Computer iPod player installed as an ASM and the wireless control unit undocked to reveal a snooze alarm kill switch and (at the bottom) contacts for interfacing directly to the control unit when it is docked.

It is envisioned that users will desire to separate the control unit from the base unit. For example, users may desire to place one or two control units on bedside tables (e.g., "his" and "her" control units), while placing the base unit on a bedroom dresser that cannot be reached from the bed. As previously stated, in some embodiments the number of "snooze" actions that can be taken may be limited, either by fixed design or in response to user input. In such embodiments, when the last alarm goes off and turns on the base unit, the remote units are preferably rendered incapable of turning off the alarm. Rather, a hardware button 702 is provided (e.g., at the back of the docking area for the remote—see FIG. 13), interfaced to the processor 155 by, for example, an interrupt operation, so a user must make an extra effort, perhaps getting out of bed and walking across the room to press this button to turn off the alarm. In some embodiments, the last alarm after multiple snooze cycles may be limited to a loud and irritating buzz supplied by the PWM signal on line 604, instead of a potentially soothing musical output. In some embodiments, the volume may be successively increased for each snooze cycle or the source for content of the sound output can be changed from one alarm to the next, to encourage the user to wake up.

A persistent alarm setting, as used herein, is one which, having been set, generates an alarm on subsequent days at the set time automatically, and does not require that the user turn the alarm on for each successive day. Thus, if a user intends to set an alarm for the same time for each weekday, the user need only set the alarm once and the user does not run the risk of oversleeping because he did not turn on the alarm before going to sleep a given evening.

Thus, many common causes of oversleeping may be avoided with proper use of the architecture and programming thus provided.

Using an internal calendar that is initialized at setup, the internal clock accounts for changes between Daylight Savings and Standard time. That, of course, is a common function on personal computers and other digital appliances. In some embodiments, provision may be made to set alarm times individually for different days of the week. The number of different days for which alarms can be set is simply a matter of manufacturing choice according to how much memory the designer wishes to devote to alarms. In some embodiments, one or more persistent alarms, for all or only selected days of the week, can be set and in some embodiments a single one-time alarm setting is provided. Any combination of persistent and one-time alarms may be provided, of course.

Aesthetics

Preferably, the base unit can be customized to the user's aesthetic taste. For example, the base unit preferably comprises a housing that holds circuit boards, speakers, jacks and other hardware, and detachable panels may be selected and attached (e.g., snapped or screwed into place or otherwise affixed) for the top, bottom, sides and back, and possibly the front, constructed from any suitable material, such as wood, metal, plastic or the like. These panels may be provided in various colors, shades and tones, painted or unpainted, with plush surfaces or textured surfaces or other embellishments. Wood panels of various types, staining, and design may be made available. If desired, the top panel can be configured as a detachable tray. Speaker grills can have various embodiments, and (for example) may have a plurality of small apertures or may be cloth covered.

It should be understood that the described user interface can present to a user a standardized interface for use in tabletop systems, automotive systems and even portable systems. The use of bandless tuning; a bit-mapped graphics display and "soft", programmable buttons; along with the described database features for accessing content from an ASM, all can be employed in those systems, together or in various groupings. The more features used in common, the more standard or unified the user interface becomes and the lower the cost of implementation. Adoption of a standard interface for automobile, home and/or office use, moreover, means the automobile driver is more likely to be able to operate the interface with minimal distraction, due to acquired familiarity and simplicity of interaction.

Having thus described several aspects of at least one embodiment of this invention, it is to be appreciated various alterations, modifications, and improvements will readily occur to those skilled in the art. Such alterations, modifications, and improvements are intended to be part of this disclosure, and are intended to be within the spirit and scope of the invention. For example, the base unit need not include a tuner at all; or it may only include a single band tuner. The base unit need not include an audio amplifier or loudspeakers; they could be in other housings. The base unit need not have the ability to receive portable music devices, network cards or the like. A system could be built wherein the control unit cannot be docked with the base unit and can only be a separate remote control. Or the control unit, when docked, might not have a direct electrical connection to the base unit; it might continue to use an RF link or it might use an infrared link or some other channel. The various features discussed above may be practiced singly or in any combination. Other variations will occur to the skilled artisan. Accordingly, the foregoing description and drawings are by way of example only.

What is claimed is:

1. A music audio control and distribution system in a location, comprising:
  A. a first wireless music audio player, control and distribution device comprising:
  a. at least one wireless network interface operably connected to a network, wherein
    (i) the network comprises a local network operably connecting the first wireless music audio player, control and distribution device with at least one of: (1) a second, separate music audio player or (2) a music audio output device, and
    (ii) the location of the local network is (a) a home, (b) an office, or (c) an automobile;
  b. a first wireless music audio player storage medium, the first wireless music audio player storage medium configured to store program instructions, music audio files, and music audio metadata, at least one of said music audio metadata identifying music audio content available from a media music audio source for at least one of: (i) downloading, (ii) streaming, or (iii) playing;
  c. a programmable processor configured to execute the program instructions stored on said first wireless music audio player storage medium, said program instructions including program instructions that when executed enable said first wireless music audio player, control and distribution device to at least in part control at least one of (i) said second, separate music audio player or (ii) said music audio output device, each operably connected to said local network;
  d. a first wireless music audio output device comprising a speaker operably connected to said programmable processor used for outputting music audio;
  e. a display screen displaying a user interface generated at least in part by the programmable processor, the user interface presenting user-selectable items including indicia of at least one of:
    (i) at least one music audio source,
    (ii) at least some music audio metadata indicative of media music audio content available from a music audio source for playing, downloading, or streaming; or
    (iii) at least one music audio player or music audio output device operably connected to said local network; and
  B. a second separate music audio device comprising at least one of (i) a music audio player or (ii) a music audio output device, the music audio player or the music audio output device each comprising a network interface operably connectable to said local network, and wherein each music audio player or music audio output device connected to said local network is controllable by said first wireless music audio player, control and distribution device.

2. The music audio control and distribution system of claim 1, wherein the display screen is a touch screen and one or more soft buttons are displayed by the touch screen for receiving a user selection of at least one of:
  (i) a music audio source;
  (ii) at least some music audio metadata from a particular music audio source indicative of music audio content available from that particular source for playing, downloading, or streaming; or
  (iii) a media music audio player or music audio output device operably connected to said local network.

3. The music audio control and distribution system of claim 1, wherein the presented music audio metadata comprises at least one of: a selection title, album, artist, playlist, content name, content characteristic, and content location.

4. The music audio control and distribution system of claim 1, wherein said music audio player comprises a portable music audio player operably connected to said local network and wherein said portable music audio player is configured, at least in part, to be controlled by said first wireless music audio player, control and distribution device.

5. The music audio control and distribution system of claim 1, wherein said music audio player comprises a computer operably connected to said local network, and wherein said computer is configured: (i) to play at least one of (a) a music audio file and (b) a music audio stream, and (ii) to be controlled, at least in part, by said first wireless music audio player, control and distribution device.

6. The music audio control and distribution system of claim 1, wherein said second music audio device comprises a music audio output device operably connected to said local network, wherein said music audio output device comprises a wireless network interface operably connecting said music audio output device to the local network.

7. The music audio control and distribution system of claim 6, wherein said music audio output device is operably connected to said first wireless music audio player, control and distribution device using a short-range wireless network protocol.

8. The music audio control and distribution system of claim 1, wherein the second music audio device comprises a plurality of different types of devices including at least one music audio player and at least one music audio output device, each operably connected to said local network.

9. A music audio control and distribution system in a location, comprising:
  A. A first portable music audio player comprising:
    a. at least one network interface operably connected to a network, wherein
      (i) the network comprises a local network operably connecting the first portable music audio player with a second wireless music audio device,
      (ii) a remote music audio source, operably connected to the local network, that is controlled at least in part via said at least one network interface, and
      (iii) the location of the local network is one of: (a) a home, (b) an office, or (c) an automobile;

b. a first portable music audio player storage medium, the first portable music audio player storage medium configured to store program instructions, music audio files, and music audio metadata, at least one of said music audio metadata identifying music audio content available to said first portable music audio player from a music audio source for at least one of: (i) downloading, (ii) streaming or (iii) playing;

c. a portable music audio player programmable processor configured to execute the program instructions stored on said first portable music audio player storage medium, said program instructions including program code that when executed enables said first portable music audio player to control at least in part one or more of: (i) a wireless music audio device connected to said local network and (ii) a second music audio player connected to said local network;

d. a first portable music audio player audio output device comprising at least one speaker operably connected to said programmable processor and used for outputting music audio;

e. a portable music audio player display screen displaying a user interface generated by the music audio player programmable processor, wherein the user interface presents user-selectable items including indicia of at least one of:
  (i) at least one music source;
  (ii) at least some music audio metadata indicative of music audio available from the music audio source for playing, downloading, or streaming; or
  (iii) at least one of: (i) a wireless music audio device, or (ii) a second music audio player; and B a second, separate wireless music audio device comprising:

a. at least one wireless network interface operably connected to said local network;

b. a wireless music audio output device comprising a speaker operably connected to a processor, and used for outputting music audio;

c. a wireless music audio device storage medium configured to store program instructions, music audio files, and music audio metadata, at least one of said music audio metadata identifying music audio content available from a music audio source for downloading, streaming, or playing;

d. a programmable processor configured to execute the program instructions stored on said wireless music audio device storage medium, said program instructions including program code that when executed enables said wireless music audio device to be controlled by said first portable music audio player operably connected to said local network;

e. a music audio device display screen arranged to display a user interface, the user interface presenting user-selectable items including indicia of at least one of:
  (i) at least one music audio source, or
  (ii) at least some music audio metadata indicative of music audio content available from a music audio source for playing, downloading, or streaming.

10. The music audio control and distribution system of claim 9, wherein the first portable music audio player display screen is a touch screen and one or more soft buttons are displayed on the touch screen for receiving a user selection of at least one of:
  (i) a music audio source;
  (ii) at least some music audio metadata from a particular music audio source indicative of music audio content available from that source for playing, downloading, or streaming; or
  (iii) the second wireless music audio device.

11. The music audio control and distribution system of claim 9, wherein the presented music audio metadata comprises at least one of: a selection title, album, artist, playlist, content name, content characteristic, and content location.

12. The music audio control and distribution system of claim 10, wherein the music audio player presented music audio metadata comprises at least one of: a selection title, album, artist, playlist, content name, content characteristic, and content location.

13. The music audio control and distribution system of claim 9, wherein said first portable music audio player is operably connected to said local network and configured at least in part to control said second wireless music audio device.

14. The music audio control and distribution system of claim 9, wherein said second wireless music audio device is a wireless music audio output device operably connected to said local network, wherein said wireless music audio output device comprises (i) a wireless network interface operably connecting said wireless music audio output device to the local network and (ii) at least one speaker used at least in part for outputting music audio.

15. The music audio control and distribution system of claim 9, wherein the first portable music audio player is connected to said second wireless music audio device using a short range wireless network protocol.

16. The music audio control and distribution system of claim 9, wherein said second wireless music audio device comprises a computer operably connected to said local network, wherein said computer is configured to play at least one of: (a) a music audio file and (b) a music audio stream and further wherein said computer is configured to be controlled at least in part by said first portable music audio player.

17. The music audio control and distribution system of claim 1, further comprising using said at least one wireless network interface to control at least in part a remote music audio source for downloading at least one music audio file or for streaming at least one music audio stream, the remote music audio source operably connected to said local network.

18. The music audio control and distribution system of claim 9, further comprising using said at least one network interface to control at least in part a remote music audio source operably connected to the local network, the remote music audio source controlled for downloading at least one music audio file or for streaming at least one music audio stream to at least one music audio player or music audio device connected to said local network.

19. The music audio control and distribution system of claim 1, wherein the local network is operably connected to an Internet router for at least one of: (i) downloading, (ii) streaming, or (iii) playing from a music audio source separate from the local network.

20. The music audio control and distribution system of claim 9, wherein the local network is operably connected to an Internet router for at least one of: (i) downloading, (ii) streaming, or (iii) playing from a music audio source separate from the local network.

* * * * *